(12) United States Patent
Snyder et al.

(10) Patent No.: US 7,659,538 B2
(45) Date of Patent: Feb. 9, 2010

(54) LAYERED COMPOSITE FILM INCORPORATING A QUANTUM DOT SHIFT REGISTER

(75) Inventors: Gary E. Snyder, Lakewood, CO (US); Wil McCarthy, Lakewood, CO (US)

(73) Assignee: RavenBrick, LLC, Denver, CO (US)

( * ) Notice: Subject to any disclaimer, the term of this patent is extended or adjusted under 35 U.S.C. 154(b) by 193 days.

(21) Appl. No.: 11/144,326

(22) Filed: Jun. 3, 2005

(65) Prior Publication Data

US 2006/0049394 A1    Mar. 9, 2006

Related U.S. Application Data

(60) Provisional application No. 60/577,239, filed on Jun. 4, 2004.

(51) Int. Cl.
*H01L 29/06* (2006.01)
*H01L 31/0328* (2006.01)
*H01L 31/072* (2006.01)

(52) U.S. Cl. ............... 257/24; 257/9; 257/14; 257/E29.07; 257/E29.071; 977/774

(58) Field of Classification Search .......... 257/14, 257/9, 23, 24, E29.071, E29.07; 977/774, 977/708
See application file for complete search history.

(56) References Cited

U.S. PATENT DOCUMENTS

| | | | |
|---|---|---|---|
| 5,274,246 A | 12/1993 | Hopkins et al. | |
| 5,347,140 A * | 9/1994 | Hirai et al. | 257/17 |
| 5,530,263 A | 6/1996 | DiVincenzo | |
| 5,757,828 A | 5/1998 | Ouchi | |
| 5,763,307 A | 6/1998 | Wang et al. | |
| 5,881,200 A | 3/1999 | Burt | |
| 5,889,288 A | 3/1999 | Futatsugi | |
| 5,937,295 A | 8/1999 | Chen et al. | |
| 6,040,859 A | 3/2000 | Takahashi | |
| 6,240,114 B1 | 5/2001 | Anselm et al. | |

(Continued)

FOREIGN PATENT DOCUMENTS

CN     1494091     5/2004

(Continued)

OTHER PUBLICATIONS

C.T. Black et al., Integration of self-assembled diblock copolymers for semiconductor capacitor fabrication, Applied Physics Letters, vol. 79, No. 3 (Jul. 16, 2001), pp. 409-411, (American Inst. of Physics, NY).

(Continued)

*Primary Examiner*—Shouxiang Hu
(74) *Attorney, Agent, or Firm*—Dorsey & Whitney LLP

(57) ABSTRACT

Quantum dots are positioned within a layered composite film to produce one-dimensional and multi-dimensional shift registers within the film. Charge carriers are driven into the quantum dots by energy in connected control paths. The charge carriers are trapped in the quantum dots through quantum confinement, such that the charge carriers form artificial atoms, which serve as dopants for the surrounding materials. The atomic number of each artificial atom is adjusted through precise variations in the voltage across the quantum dot that confines it. The position of the artificial atom in the film is moved by varying the location of confinement and thus operates as a shift register.

14 Claims, 8 Drawing Sheets

U.S. PATENT DOCUMENTS

| | | | |
|---|---|---|---|
| 6,281,519 B1 | 8/2001 | Sugiyama et al. | |
| 6,294,794 B1 | 9/2001 | Yoshimura et al. | |
| 6,304,784 B1 | 10/2001 | Allee et al. | |
| 6,320,220 B1 | 11/2001 | Watanabe et al. | |
| 6,329,668 B1 | 12/2001 | Razeghi | |
| 6,333,516 B1* | 12/2001 | Katoh et al. | 257/22 |
| 6,437,361 B1 | 8/2002 | Matsuda | |
| 6,498,354 B1 | 12/2002 | Jefferson et al. | |
| 6,512,242 B1 | 1/2003 | Fan et al. | |
| 6,600,169 B2 | 7/2003 | Stintz et al. | |
| 6,611,640 B2 | 8/2003 | LoCasclo et al. | |
| 6,777,718 B2 | 8/2004 | Takagi | |
| 6,816,525 B2 | 11/2004 | Stintz et al. | |
| 6,978,070 B1 | 12/2005 | McCarthy et al. | |
| 7,026,641 B2 | 4/2006 | Mohseni et al. | |
| 2002/0080842 A1 | 6/2002 | An et al. | |
| 2002/0152191 A1* | 10/2002 | Hollenberg et al. | 707/1 |
| 2002/0190249 A1* | 12/2002 | Williams et al. | 257/14 |
| 2003/0059998 A1 | 3/2003 | Holonyak et al. | |
| 2003/0066998 A1 | 4/2003 | Lee | |
| 2003/0107927 A1 | 6/2003 | Yerushami et al. | |
| 2004/0042266 A1* | 3/2004 | Tamura et al. | 365/173 |
| 2004/0256612 A1* | 12/2004 | Mohseni et al. | 257/14 |
| 2005/0157996 A1 | 7/2005 | McCarthy et al. | |
| 2005/0157997 A1 | 7/2005 | McCarthy et al. | |
| 2006/0011904 A1 | 1/2006 | Snyder et al. | |
| 2006/0151775 A1* | 7/2006 | Hollenberg et al. | 257/14 |

FOREIGN PATENT DOCUMENTS

| | | |
|---|---|---|
| GB | 2261989 | 6/1993 |
| JP | 10-260381 | 9/1998 |
| JP | 2003-248204 | 9/2003 |
| KR | 10-2002-0013986 | 2/2002 |
| WO | WO 2005/122266 | 12/2005 |
| WO | WO 2007/120983 | 10/2007 |
| WO | WO 2008/106596 | 9/2008 |

OTHER PUBLICATIONS

Ting Xu et al., The influence of molecular weight on nanoporous polymer films, Polymer, 42 (Apr. 2001), pp. 9091-9095 (Elsevier Science Ltd.).
Du Yeol Ryu et al., A generalized approach to the modification of solid surfaces, Science, vol. 308 (Apr. 8, 2005), pp. 236-239.
Hyongsok T. Soh et al., Scanning probe lithography, ch. 3, pp. 40-66, (2001) (Kluwer Academic Publishers, Norwell MA).
McCarthy, Wil, "Programmable Matter", Nature, 407:127, Oct. 5, 2000.
McCarthy, Wil, "The Collapsium", Del Rey Books, Aug. 2000 and Orion Books, Oct. 2000.
Leatherdale, C.A., et al., "Photoconductivity in CdSe Quantum Dot Solids", Phys. Review B, 62(4):2669-2680, Jul. 15, 2000.
McCarthy, Wil, "Once Upon a Matter Crushed", Science Fiction Age, Jul. 1999.
Kouwenhoven, Leo et al., "Quantum Dots", Physics World, Jun. 1988.
Goldhaber-Gordon, D., et al., "Overview of Nanoelectronic Devices", Proceedings of the IEEE, 85(4):521-533, Apr. 1997.
Turton, Richard, "The Quantum Dot", Oxford University Press, 1995.
Kastner, Marc A., "Artificial Atoms", Physics Today, Jan. 1993.
Orlov, Alexei O., et al., Clocked Quantum-Dot Cellular Automata Devices: Experimental Studies, IEEE-NANO 2001, Oct. 30, 2001, pp. 425-430.
Office Action Requirement for Restriction/Election, U.S. Appl. No. 11/081,777, mailed Jan. 2, 2008, 5 pages.
Response to Restriction Requirement, U.S. Appl. No. 11/081,777, filed Jan. 28, 2008, 7 pages.
Office Action Non-Final Rejection, U.S. Appl. No. 11/081,777, mailed May 12, 2008, 9 pages.
Amendment and Response to Non-Final Office Action with Terminal Disclaimer, U.S. Appl. No. 11/081,777, filed Oct. 10, 2008, 14 pages.
Office Action Final Rejection, U.S. Appl. No. 11/081,777, mailed Jan. 6, 2009, 9 pages.
Amendment and Response to Final Office Action, U.S. Appl. No. 11/081,777, filed Mar. 6, 2009, 7 pages.
Notice of Allowance and Fee(s) Due, U.S. Appl. No. 11/081,777, mailed Mar. 31, 2009.
Office Action, U.S. Appl. No. 11/676,785, mailed Aug. 27, 2008, 5 pages.
Response to Restriction Requirement, U.S. Appl. No. 11/676,785, filed Sep. 29, 2008, 10 pages.
Office Action and PTOL-892, U.S. Appl. No. 11/676,785, mailed Feb. 6, 2009, 14 pages.
Preliminary Amendment, U.S. Appl. No. 11/145,417, filed Mar. 29, 2006, 4 pages.
Office Action and PTOL-892, U.S. Appl. No. 11/145,417, mailed Sep. 26, 2008, 13 pages.
Amendment and Response, U.S. Appl. No. 11/145,417, filed Jan. 26, 2009, 15 pages.
Office Action and PTOL-892, U.S. Appl. No. 09/964,927, filed Jun. 9, 2003, 10 pages.
Response to Office Action, U.S. Appl. No. 09/964,927, filed Aug. 8, 2003, 7 pages.
Revised Second Amendment and Response to Office Action, U.S. Appl. No. 09/964,927, filed Oct. 24, 2003, 14 pages.
Final Rejection and PTOL-892, U.S. Appl. No. 09/064,927, filed Jan. 2, 2004, 7 pages.
Third Amendment and Response to Final Office Action and Interview Summary, U.S. Appl. No. 09/964,927, filed Mar. 2, 2004, 13 pages.
Advisory Action and Interview Summary, U.S. Appl. No. 09/964,927, filed Mar. 22, 2004, 5 pages.
Fourth Amendment, U.S. Appl. No. 09/964,927, filed Jun. 17, 2004, 10 pages.
Office Action, U.S. Appl. No. 09/964,927, filed Nov. 19, 2004, 5 pages.
Response to Restriction Requirement, U.S. Appl. No. 09/964,927, filed Dec. 8, 2004, 2 pages.
Notice of Allowability, U.S. Appl. No. 09/964,927, filed Jan. 28, 2005, 4 pages.
Non-Final Rejection and PTOL-892, U.S. Appl. No. 09/964,927, filed Apr. 22, 2005, 8 pages.
Response to Non-Final Office Action After Withdrawal from Issue, U.S. Appl. No. 09/964,927, filed May 12, 2005, 3 pages.
Final Rejection, U.S. Appl. No. 09/064,927, filed Jun. 8, 2005, 8 pages.
Response to Final Office Action After Withdrawal from Issue, U.S. Appl. No. 09/964,927, filed Jul. 13, 2005, 14 pages.
Notice of Allowability, U.S. Appl. No. 09/964/927, filed Jul. 21, 2005, 6 pages.
Non-Final Rejection and PTOL-892, U.S. Appl. No. 11/081,778, filed May 19, 2006, 7 pages.
Response to Office Action, U.S. Appl. No. 11/081,778, filed Aug. 21, 2006, 9 pages.
Final Rejection, U.S. Appl. No. 11/081,778, filed Nov. 2, 2006, 7 pages.
Response to Office Action, U.S. Appl. No. 11/081,778, filed Jan. 3, 2007, 13 pages.
Advisory Action Before the Filing of an Appeal Brief, U.S. Appl. No. 11/081,778, filed Feb. 1, 2007, 4 pages.
Notice of Allowability and PTOL-892, U.S. Appl. No. 11/081,778, filed May 22, 2007, 4 pages.

\* cited by examiner

PRIOR ART

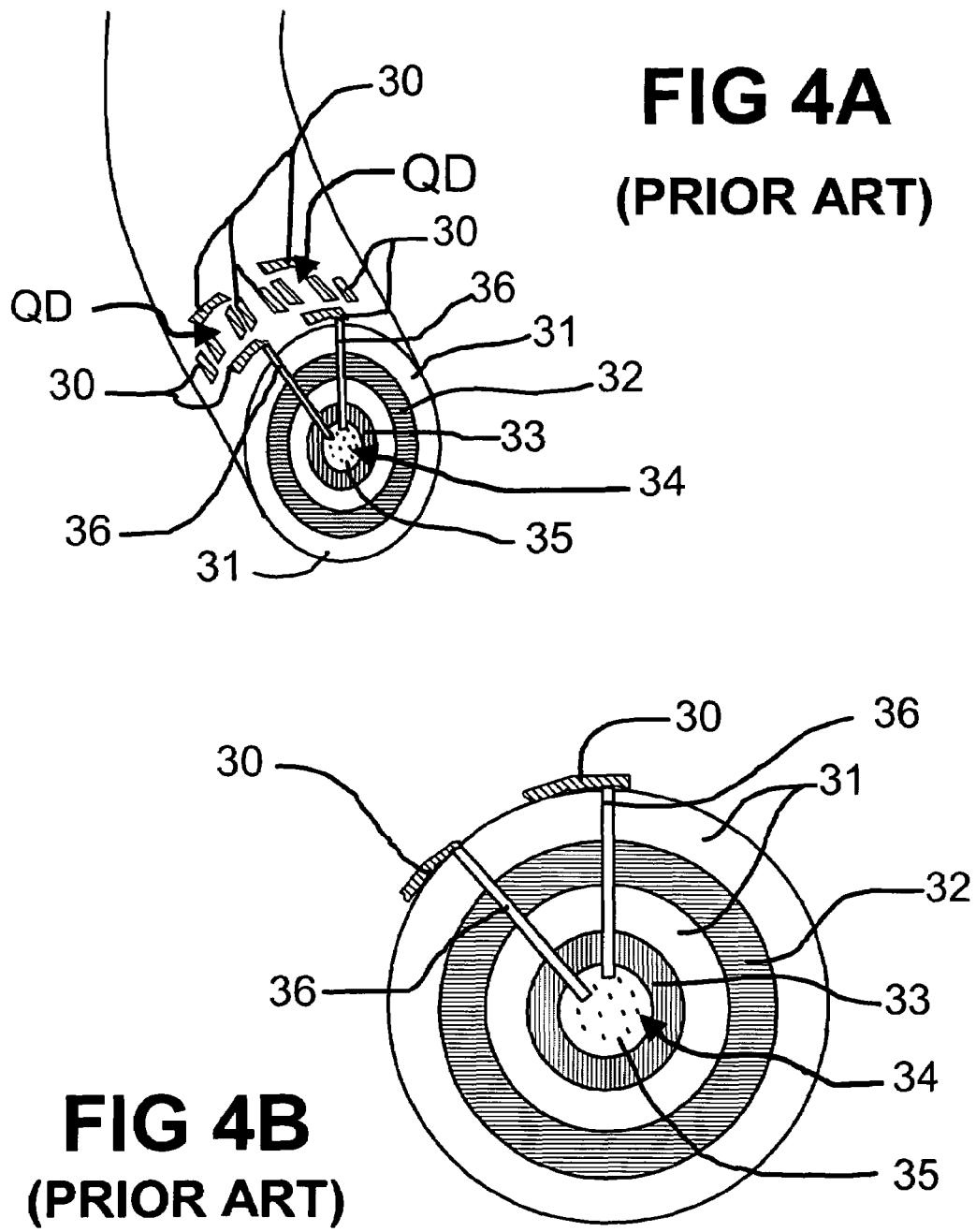

LAYERED COMPOSITE FILM INCORPORATING A QUANTUM DOT SHIFT REGISTER

CROSS REFERENCE TO RELATED APPLICATIONS

This application claims priority pursuant to 35 U.S.C. § 119(e) of U.S. provisional patent application No. 60/577,239 filed 4 Jun. 2004, which is hereby incorporated by reference in its entirety as though fully set forth herein. This application is also related to copending U.S. application Ser. No. 11/145, 417 filed concurrently herewith, which is hereby incorporated by reference in its entirety as though fully set forth herein.

BACKGROUND OF THE INVENTION

1. Field of the Invention

This invention relates to a device for producing quantum effects: a layered composite film incorporating quantum dot devices, which include electrodes controlled by an external energy source. The invention has particular, but not exclusive, application in materials science, as a quantum dot shift register.

2. Description of the Related Art

The fabrication of very small structures to exploit the quantum mechanical behavior of charge carriers e.g., electrons or electron "holes" is well established. Quantum confinement of a carrier can be accomplished by a structure whose linear dimension is less than the quantum mechanical wavelength of the carrier. Confinement in a single dimension produces a "quantum well," and confinement in two dimensions produces a "quantum wire."

A quantum dot is a structure capable of confining carriers in all three dimensions. Quantum dots can be formed as particles, with a dimension in all three directions of less than the de Broglie wavelength of a charge carrier. Quantum confinement effects may also be observed in particles of dimensions less than the electron-hole Bohr diameter, the carrier inelastic mean free path, and the ionization diameter, i.e., the diameter at which the carrier's quantum confinement energy is equal to its thermal-kinetic energy. It is postulated that the strongest confinement may be observed when all of these criteria are met simultaneously. Such particles may be composed of semiconductor materials (for example, Si, GaAs, AlGaAs, InGaAs, InAlAs, InAs, and other materials), or of metals, and may or may not possess an insulative coating. Such particles are referred to in this document as "quantum dot particles."

A quantum dot can also be formed inside a semiconductor substrate through electrostatic confinement of the charge carriers. This is accomplished through the use of microelectronic devices of various design, e.g., an enclosed or nearly enclosed gate electrode formed on top of a quantum well. Here, the term "micro" means "very small" and usually expresses a dimension of or less than the order of microns thousandths of a millimeter. The term "quantum dot device" refers to any apparatus capable of generating a quantum dot in this manner. The generic term "quantum dot," abbreviated "QD" in certain of the drawings herein, refers to any quantum dot particle or quantum dot device.

The electrical, optical, thermal, magnetic, mechanical, and chemical properties of a material depend on the structure and excitation level of the electron clouds surrounding its atoms and molecules. Doping is the process of embedding precise quantities of carefully selected impurities in a material in order to alter the electronic structure of the surrounding atoms for example, by donating or borrowing electrons from them, and therefore altering the material's electrical, optical, thermal, magnetic, mechanical, or chemical properties. Impurity levels as low as one dopant atom per billion atoms of substrate can produce measurable deviations from the expected behavior of a pure crystal, and deliberate doping to levels as low as one dopant atom per million atoms of substrate are commonplace in the semiconductor industry for example, to alter the band gap of a semiconductor.

Kastner, "Artificial Atoms," Physics Today (January 1993), points out that the quantum dot can be thought of as an "artificial atom," since the carriers confined in it behave similarly in many ways to electrons confined by an atomic nucleus. The term "artificial atom" is now in common use, and is often used interchangeably with "quantum dot." However, for the purposes of this document, "artificial atom" refers specifically to the pattern of confined carriers, e.g., a zero-dimensional electron gas, and not to the particle or device in which the carriers are confined. Kastner describes the future potential for "artificial molecules" and "artificial solids" composed of quantum dot particles. Specifics on the design and function of these molecules and solids are not provided.

Quantum dots can have a greatly modified electronic structure from the corresponding bulk material, and therefore different properties. Quantum dots can also serve as dopants inside other materials. Because of their unique properties, quantum dots are used in a variety of electronic, optical, and electro-optical devices. Quantum dots are currently used as near-monochromatic fluorescent light sources, laser light sources, light detectors including infra-red detectors, and highly miniaturized transistors, including single-electron transistors. They can also serve as a useful laboratory for exploring the quantum mechanical behavior of confined carriers. Many researchers are exploring the use of quantum dots in artificial materials, and as dopants to affect the optical and electrical properties of semiconductor materials.

The embedding of metal and semiconductor nanoparticles inside bulk materials (e.g., the lead particles in leaded crystal) has occurred for centuries. However, an understanding of the physics of these materials has only been understood comparatively recently. These nanoparticles are quantum dots with characteristics determined by their size and composition. These nanoparticles serve as dopants for the material in which they are embedded to alter selected optical or electrical properties. The doping characteristics of the quantum dots are fixed at the time of manufacture and cannot be adjusted thereafter.

In general, the prior art almost completely overlooks the broader materials-science implications of quantum dots. The ability to place programmable dopants in a variety of materials implies a useful control over the bulk properties of these materials. This control could take place not only at the time of fabrication of the material, but also in real time, i.e., at the time of use, in response to changing needs and conditions. However, there is virtually no discussion of the use, placement, or control of programmable quantum dots in the interior of bulk materials. Similarly, there is no discussion of the placement of large arrays of electrically controlled quantum dot devices in one or more layers within a bulk material. There are hints of these concepts in a handful of references, discussed below.

Leatherdale et al., "Photoconductivity in CdSe Quantum Dot Solids," Physics Review B (15 Jul. 2000), describe, in detail, the fabrication of "two- and three-dimensional . . . artificial solids with potentially tunable optical and electrical properties." These solids are composed of colloidal semiconductor nanocrystals deposited on a semiconductor substrate. The result is an ordered, glassy film composed of quantum dot particles, which can be optically stimulated by external light sources or electrically stimulated by electrodes attached to the substrate to alter optical and electrical properties. These films are extremely fragile and are "three-dimensional" only in the sense that they have been made up to several microns thick. The only parameter that can be adjusted electrically through changes in the source and drain voltage on the substrate is the average number of electrons in the quantum dots. Slight variations in the size and composition of the quantum dot particles mean that the number of electrons will vary slightly between quantum dots. However, on average the quantum dot particles will all behave similarly.

U.S. Pat. No. 5,881,200 to Burt discloses an optical fiber (1) containing a central opening (2) filled with a colloidal solution (3) of quantum dots (4) in a support medium. See prior art FIGS. 1 and 2 herein. The purpose of the quantum dots is to produce light when optically stimulated, for example, to produce optical amplification or laser radiation. The quantum dots take the place of erbium atoms, which can produce optical amplifiers when used as dopants in an optical fiber. The characteristics of the quantum dots can be influenced by the selection of size and composition at the time of manufacture.

U.S. Pat. No. 5,889,288 to Futatsugi discloses a semiconductor quantum dot device that uses electrostatic repulsion to confine electrons. This device consists of electrodes (16a), (16b), and (17) controlled by a field effect transistor all formed on the surface of a quantum well on a semi-insulating substrate (11). See prior art FIGS. 3A and 3B herein. This arrangement permits the exact number of electrons trapped in the quantum dot (QD) to be controlled by varying the voltage on the gate electrode G. This is useful, in that it allows the "artificial atom" contained in the quantum dot to take on characteristics similar to any natural atom on the periodic table, and also transuranic and asymmetric atoms which cannot easily be created by other means. The two-dimensional nature of the electrodes means that the artificial atom can exist only at or near the surface of the wafer.

Kouwenhoven et al., "Quantum Dots," Physics World, (June 1998), describe the process of manipulating an artificial atom confined in a similar device, including changing its atomic number by varying the voltage on a gate electrode. The described device is capable of holding up to 100 electrons, whose "periodic table" is also described, and is different from the periodic table for normal atoms since the quantum confinement region is nonspherical. The materials science implications of this are not discussed.

Turton, "The Quantum Dot," Oxford University Press (1995), describes the possibility of placing such quantum dot devices in two-dimensional arrays on a semiconductor microchip as a method for producing new materials, for example, through the combination of adjacent artificial atoms as "molecules." This practice has since become routine, although the spacing of the quantum dot devices is typically large enough that the artificial atoms formed on the chip do not interact significantly nor do they produce macroscopically significant doping effects.

Goldhaber-Gordon et al., "Overview of Nanoelectronic Devices," Proceedings of the IBEE, Vol. 85, No. 4, (April 1997), describe what may be the smallest possible single-electron transistor. This consists of a "wire" made of conductive $C_6$ benzene molecules with a "resonant tunneling device," or "RTD," inline that consists of a benzene molecule surrounded by $CH_2$ molecules, which serve as insulators. The device is described, perhaps incorrectly, as a quantum well (rather than a quantum dot) and is intended as a switching device transistor rather than a confinement mechanism for charge carriers. However, in principle the device should be capable of containing a small number of excess electrons and thus forming a primitive sort of artificial atom. Thus, the authors remark that the device may be "much more like a quantum dot than a solid state RTD." See p. 19. The materials science implications of this are not discussed.

U.S. Pat. No. 6,512,242 to Fan et. al. describes a device for producing quantum effects comprising a quantum wire (504), energy carried along the quantum wire under voltage control, and quantum dots (502, 503) near the quantum wire that hold energy. The quantum wire transports electrons into and out of a quantum dot or plurality of quantum dots through "resonant tunneling" rather than through any direct connection between the quantum wire and the quantum dot. As described by Fan et al., the quantum dots serve as "resonant coupling elements" that transport electrons between the quantum wire acting as an electronic waveguide or between different ports on the same waveguide. In other words, the quantum dots serve as a kind of conduit. However, there is no means for controlling the number of electrons trapped inside the quantum dots at any given time, nor for controlling the size or shape of any artificial atom that might briefly and incidentally exist there.

U.S. Patent Application Publication US 2002/0079485 A1 by Stinz. et. al discloses a "quantum dash" device that can be thought of as an asymmetric quantum dot particle with elongated axes, or as a short, disconnected segment of quantum wire. In this sense, quantum dashes are merely a special class of quantum dot particles. As described by Stinz et al., a plurality of the quantum dash devices are embedded at particular locations inside a solid material to enhance the excitation of laser energy within the material. The resulting structure is a "tunable laser" with an output frequency that can be adjusted over a narrow range. This tuning is accomplished through "wavelength selective feedback" using an external optical grating to limit the input light frequencies that can reach the dashes inside the material. The publication notes that "an ensemble of uniformly sized quantum dashes that functioned as ideal quantum dots would have an atomic-like density of states and optical gain." Stinz et al. relies on the exact geometry and composition of the semiconductor material to produce quantum dashes of a particular size and shape. Therefore, selection of the available quantum states is achieved exclusively at the time of manufacture, "with a variety of length-to-width-to-height ratios, for example, by adjusting the InAs monolayer coverage, growth rate, and temperature." While a beam of photons with carefully selected energies can excite these charge carriers inside the quantum dashes, it cannot alter the fixed size or shape of the quantum dashes. The energy affects all the quantum dashes equally, along with the surrounding material in which they are embedded. Furthermore, if the surrounding material is opaque, then photon energy cannot reach the quantum dashes at all.

U.S. Patent application No. US 2002/0114367 A1 by Stinz et. al. discloses "an idealized quantum dot layer that includes a multiplicity of quantum dots embedded in a quantum well layer sandwiched between barrier layers." Similarly, U.S. Pat. No. 6,294,794 B1 to Yoshimura et. al. discloses "a plurality of quantum dots in an active layer such that the quantum dots have a composition or doping modified asymmetric in a direction perpendicular to the active layer." These quantum dot particles are simply embedded in an optical crystal. Yoshimura et. al. suggest the use of quantum dots as dopants and introduce the concept of asymmetric dopants with nonlinear effects. A similar quantum dot layer structure is disclosed in U.S. Pat. No. 6,281,519 B1 to Sugiyama et. al.

McCarthy, "Once Upon a Matter Crushed," Science and Fiction Age (July 1999), in a science fiction story, includes a fanciful description of "wellstone," a form of "programmable matter" made from "a diffuse lattice of crystalline silicon, superfine threads much finer than a human hair," which use "a careful balancing of electrical charges" to confine electrons in free space, adjacent to the threads. This is probably physically impossible, as it would appear to violate Coulomb's Law, although we do not wish to be bound by this. Similar text by the same author appears in McCarthy, "The Collapsium," Del Rey Books (August 2000), and McCarthy, "Programmable Matter," Nature (5 Oct. 2000). Detailed information about the composition, construction, or functioning of these devices is not given.

U.S. patent application Ser. No. 09/964,927 by McCarthy et. al. discloses a fiber incorporating quantum dots as programmable dopants, and discusses the use of such fibers in materials science, either by embedding one or more fibers inside a bulk material or by braiding, stacking, or weaving the fibers together. The application discloses an embodiment wherein the fibers are flat ribbons. Prior art FIGS. 4A and 4B show a fiber containing control wires (34) in an insulating medium (35), surrounded by a quantum well, plus an optional memory layer (33). The quantum well is formed by a central or transport layer (32) of a semiconductor (similar to the negative layer of a P—N—P junction) surrounded by barrier or supply layers (31) of a semiconductor with higher conduction energy (similar to the positive layers of a P—N—P junction). The surface of the fiber includes conductors that serve as the electrodes (30) of a quantum dot device. These electrodes (30) confine charge carriers in the quantum well into a small space or quantum dot (QD) when a reverse-bias voltage is applied, since the negative charge on the electrodes (30) repels electrons, preventing their horizontal escape through the transport layer (32). The electrodes (30) are powered by control wire branches (36) reaching to the surface of the fiber from the control wires (34) in the center of the fiber. Once the charge carriers are trapped in a quantum dot (QD), they form an artificial atom that is capable of serving as a dopant. Increasing the voltage on the electrodes (30) by a specific amount forces a specific number of additional carriers into the quantum dot (QD), altering the atomic number of the artificial atom trapped inside. Conversely, decreasing the voltage by a specific amount allows a specific number of carriers to escape to regions of the transport layer (32) outside the quantum dot (QD). Thus, the doping properties of the artificial atom are adjusted in real time through variations in the signal voltage of the control wires (34) at the fiber's center.

Hennessy et al., "Clocking of molecular quantum-dot cellular automata," J. Vac. Sci. Technol. B, pp. 1752-1755 (September/October 2001), disclose a one-dimensional shift register composed of quantum dots, for use in computer logic and memory. The items shifted are binary bits of information, represented by single electrons in the dots. Such single electrons could be regarded as a degenerate form of artificial atom (i.e., an artificial "hydrogen" atom), although the structures are not described that way. Any materials science implications of the electron confinement is not addressed. The system described is neither intended for nor capable of shifting artificial atoms of arbitrary size, shape, or energy level.

The information included in this Background section of the specification, including any references cited herein and any description or discussion thereof, is included for technical reference purposes only and is not to be regarded subject matter by which the scope of the invention is to be bound.

SUMMARY OF THE INVENTION

The present invention is directed to the use of quantum dots within a layered composite film to produce a plurality of real-time programmable dopants within the film. The term "programmable dopant composite film" refers to a sandwich of heterogeneous materials with quantum dots populating, attached to, embedded in, or forming its upper surface. This should not be confused with a quantum well, which is a structure for carrier confinement in one dimension only. An energy-transporting structure is included in the composite film to control the properties of the quantum dot dopants using external energy sources, even when the quantum dot dopants are embedded in solid materials, including opaque or electrically insulating materials that would ordinarily isolate the quantum dots from external influences.

According to the present invention, charge carriers are driven into the quantum dots by the energy in control paths and are trapped in the quantum dots through quantum confinement, such that the charge carriers form artificial atoms, which serve as dopants for the surrounding materials. The atomic number of each artificial atom is adjusted through precise variations in the voltage across the quantum dot that confines it. The change in atomic number alters the doping characteristics of the artificial atoms.

In some embodiments of the present invention, the excitation level of the artificial atom is also controlled, either through additional electrical voltages or through optical or electromagnetic stimulation. Additionally, in some embodiments of the invention, the energy in the control paths creates electric fields that affect the quantum confinement characteristics of the quantum dots. This produces controlled and repeatable distortions in the size and shape of the artificial atoms, further altering their doping characteristics with a corresponding effect on the surrounding materials.

Since the electrical, optical, thermal, magnetic, mechanical, and chemical properties of a material depend on its electronic structure, and since the embedding of dopants can affect this structure, the novel programmable dopant composite film of the present invention offers a means for controlling the interior properties of a bulk material in real time. These material effects are a consequence of manipulating the internal electron arrangements of the bulk material, i.e., its electronic structure.

The structure, composition, manufacture, and function of quantum dot particles generally is taught in U.S. Patent Application Publication No. 2003/0066998 by Lee et al., which is hereby incorporated by reference as though fully set forth herein. The structure, composition, manufacture, and function of exemplary quantum dot devices is taught in U.S. Pat. No. 5,889,288 to Futatsugi, which is hereby incorporated by reference as though fully set forth herein. It will be understood by a person of ordinary skill in the art that the quantum dot particles or quantum dot devices employed by the present invention may be of different design than those described by Lee et al. and Futatsugi, but that their operating principles are essentially identical.

The function of quantum dots as dopants has been recognized in certain instances in the prior art, for example, in thin films and on the surfaces of microchips. It is understood that quantum dots can have a greatly modified electronic structure from the corresponding bulk material, and therefore exhibit different material properties, for example, different optical and electrical properties. The use of quantum dots as dopants inside other materials has been described, for example, in U.S. Patent Application Publication No. 2002/0041736 A1 by LoCasclo et. al., paragraph 0045. The term "artificial atom" is also in common use—for example, in U.S. Pat. No. 6,498,354 to Jefferson et. al.—and is often used interchangeably with "quantum dot." The idea that a change in the energy level applied to a quantum dot can vary the number of confined electrons and thus the "atomic number" of the artificial atom was considered by Turton, supra.

The present invention reorganizes these principles or devices in a novel and useful way, namely as a composite film or layered material with quantum dot devices attached to its surface whether upper, lower, or both, and with one or more control wires running along or within the composite to control the doping properties of the quantum dots, even in the interior of bulk materials.

In one form, the present invention is seen in a device for producing quantum effects. The device comprises a material fashioned into a thin, flexible film and a plurality of quantum dots, physically connected with the material. A control path is physically connected with the material and operatively coupled with the plurality of quantum dots. The control path is adapted to carry energy from an energy source to the plurality of quantum dots. The device further comprises a plurality of charge carriers capable of being confined within the plurality of quantum dots to form a respective plurality of artificial atoms. The energy is adapted to cause an electric potential across each of the quantum dots to confine a respective subset of the plurality of charge carriers in a controlled configuration within each quantum dot to form a respective artificial atom. The energy determines the size, shape, atomic number, and/or energy level of each artificial atom of the respective plurality of artificial atoms confined in each respective quantum dot. The plurality of artificial atoms alter the electrical, optical, thermal, magnetic, mechanical, and/or chemical properties of the material.

In another form, the present invention is a device for producing quantum effects comprising a thin, flexible film. The film comprises a transport layer and a barrier layer. The transport layer and the barrier layer together form a heterojunction. The device further comprises an electrode supported on the film and a control path physically connected with the film and operatively coupled with the electrode. The control path is adapted to carry energy from an energy source to the electrode. The device additionally comprises a plurality of charge carriers capable of being confined within a gas layer of the heterojunction to form a plurality of artificial atoms. When energized, the electrode creates an electric field that interacts with the heterojunction and causes the formation of a plurality of potential barriers that correspond to a plurality of quantum dots. The plurality of quantum dots confine multiple subsets of the charge carriers in the gas layer of the heterojunction in a controlled configuration to form the plurality of artificial atoms. The energy determines the size, shape, atomic number, and/or energy level of the plurality of artificial atoms corresponding to plurality of quantum dots. The plurality of artificial atoms alter the electrical, optical, thermal, magnetic, mechanical, and/or chemical properties of the device.

In an additional form, the present invention is a device for producing quantum effects comprising a thin, flexible film. The film further comprises a first barrier layer, a second barrier layer, and a transport layer located between the first barrier layer and the second barrier layer. An electrode is supported on the film and a control path is physically connected with the film and operatively coupled with the at least one electrode. The control path is adapted to carry energy from an energy source to the electrode. The device additionally comprises a plurality of charge carriers capable of being confined within specific areas of the transport layer to form a plurality of artificial atoms. When energized, the electrode creates an electric field that interacts with the first barrier layer, the second barrier layer, and the transport layer to instantiate a plurality of potential barriers that form a plurality of quantum dots. The plurality of quantum dots confine multiple subsets of the charge carriers in the transport layer in a controlled configuration to form the plurality of artificial atoms. The energy determines the size, shape, atomic number, and/or energy level of the plurality of artificial atoms corresponding to the plurality of quantum dots. The plurality of artificial atoms alter the electrical, optical, thermal, magnetic, mechanical, and/or chemical properties of the device.

In another form, the present invention is a shift register comprising a thin, flexible film, a plurality of quantum dots, physically connected with the film, a plurality of charge carriers, a plurality of electrodes, and a plurality of control paths. The plurality of charge carriers are capable of being confined within the plurality of quantum dots to form a respective plurality of artificial atoms. The plurality of electrodes are electrically insulated from each adjacent electrode. Each electrode is interposed between a respective pair of the plurality of quantum dots. A plurality of control paths are physically connected with the film and operatively coupled with the plurality of electrodes. Each the plurality of control paths is electrically coupled with a respective subset of the plurality of electrodes. Each of the plurality of control paths is adapted to carry energy to the plurality of electrodes. A first one of the plurality of quantum dots is located between a first pair of the plurality of electrodes. A second one of the plurality of quantum dots is located between a second pair of the plurality of electrodes. The first pair of electrodes is energized via at least a first one of the plurality of control paths to trap and hold a first controlled configuration of charge carriers in the first quantum dot, thus forming a first artificial atom of particular size, shape, atomic number, and/or energy level. The first artificial atom is relocated within the film by energizing the second pair of electrodes via at least a second one of the plurality of control paths to trap and hold a second controlled configuration of charge carriers in the second quantum dot, thus forming a second artificial atom of particular size, shape, atomic number, and/or energy level identical to the first artificial atom.

In yet another form, the present invention is a one-dimensional shift register comprising a thin, flexible film comprising two or more layers of semiconductor material, a plurality of charge carriers capable of being confined within the film to form artificial atoms, a plurality of parallel electrodes, a plurality of control paths, and a plurality of voltage sources. Each of the plurality of electrodes is spaced apart from each adjacent electrode. The plurality of control paths is physically connected with the film, operatively coupled with the plurality of electrodes, and adapted to carry energy to the plurality of electrodes. Each of the plurality of voltage sources is electrically connected via one or more of the plurality of control paths with one or more of the plurality of electrodes. A first one of the plurality of quantum dots is located between a first pair of the plurality of electrodes. A second one of the plurality of quantum dots is located between a second pair of the plurality of electrodes The first pair of electrodes is energized via at least a first one of the plurality of control paths to trap and hold a first controlled configuration of charge carriers in the first quantum dot, thus forming a first artificial atom of particular size, shape, atomic number, and/or energy level. The first artificial atom is relocated within the film by energizing the second pair of electrodes via at least a second one of the plurality of control paths to trap and hold a second controlled configuration of charge carriers in the second quantum dot, thus forming a second artificial atom of particular size, shape, atomic number, and/or energy level identical to the first artificial atom.

In a further form, the present invention is a multi-dimensional shift register comprising a plurality of quantum dot shift registers. Each of the quantum dot shift registers comprises a thin, flexible film comprising two or more layers of semiconductor material adapted to confine a plurality of charge carriers in two dimensions, a plurality of parallel electrodes, a plurality of quantum dots, a plurality of control paths, and a plurality of voltage sources. Each of the plurality of electrodes is spaced apart from each adjacent electrode. The plurality of quantum dots are capable of being formed in the film between adjacent ones of the plurality of electrodes. The plurality of control paths are physically connected with the film, operatively coupled with the plurality of electrodes, and adapted to carry energy to the plurality of electrodes. Each of the plurality of voltage sources is electrically connected via one or more of the plurality of control paths with one or more of the plurality of electrodes. A first one of the plurality of quantum dots is located between a first pair of the plurality of electrodes. A second one of the plurality of quantum dots is located between a second pair of the plurality of electrodes. The first pair of electrodes is energized via at least a first one of the plurality of control paths to trap and hold a first controlled configuration of charge carriers in the first quantum dot, thus forming a first artificial atom of particular size, shape, atomic number, and/or energy level. The first artificial atom is relocated within the film by energizing the second pair of electrodes via at least a second one of the plurality of control paths to trap and hold a second controlled configuration of charge carriers in the second quantum dot, thus forming a second artificial atom of particular size, shape, atomic number, and/or energy level identical to the first artificial atom. The multi-dimensional shift register is then formed by a first quantum dot shift register of the plurality of quantum dot shift registers and a first array of quantum dot shift registers of the plurality of quantum dot shift registers arranged parallel to each other and perpendicular to the first quantum dot shift register. Each of the plurality of parallel electrodes of the quantum dot shift registers in the first array is common to each of the quantum dot shift registers in the first array.

Accordingly, several objects and advantages of the present invention may be realized. First, the present invention provides a three-dimensional structure for quantum dots that may be considerably more robust than a nanoparticle film. For example, a contiguous Si or GaAs film is held together by atomic bonds, as opposed to the much weaker Van der Waals forces that hold nanoparticle films together.

Second, the present invention provides a method for the electrical and/or optical stimulation of quantum dot particles embedded inside bulk materials. A layer of quantum dots also comprises, one or more wires or optical conduits that are electrically and/or optically isolated from the material in which they are embedded. These pathways branch directly to the quantum dot particles or devices on the surface of the layer, providing the means to stimulate them.

Third, the present invention provides a method for embedding and controlling electrostatic quantum dot devices and other types of quantum dot devices inside bulk materials, rather than at their surfaces.

Fourth, the present invention permits the doping characteristics of quantum dots inside a material to be controlled by external signals, and thus varied by a user at the time of use. Thus, the properties of the bulk material can be tuned in real time, in response to changing needs or circumstances.

Fifth, in the present invention, the programmable dopant layer can be used outside of bulk materials in applications where quantum dots, quantum wires, and nanoparticle films are presently used. For example, the programmable dopant layer can serve as a microscopic light source or laser light source.

Sixth, in the present invention multiple programmable dopant layers can be stacked into three-dimensional structures whose properties can be adjusted through external signals, forming a type of "programmable matter," which is a bulk solid with variable electrical, optical, thermal, magnetic, mechanical, and chemical properties. These properties can be tuned in real time through the adjustment of the energies in the control paths that affect the properties of artificial atoms used as dopants.

Seventh, in the present invention the resulting programmable materials, unlike nanoparticle films, can contain artificial atoms of numerous and variably different types, if desired. Thus, the number of potential uses for materials based on programmable dopant layers is vastly greater than for the materials based on nanoparticle films.

Other features, details, utilities, and advantages of the present invention will be apparent from the following more particular written description of various embodiments of the invention as further illustrated in the accompanying drawings and defined in the appended claims.

BRIEF DESCRIPTION OF THE DRAWINGS

In the drawings, closely related figures have the same element numbers, except for FIGS. 1-4B from the prior art.

FIGS. 4A and 4B are from the prior art, U.S. patent application Ser. No. 09/964,927, and are schematic drawings of a multilayered microscopic fiber that includes a quantum well, surface electrodes, which form quantum dot devices, and control wires to carry electrical signals to the electrodes.

DETAILED DESCRIPTION OF THE INVENTION

The present invention is directed to the use of quantum dots within a layered composite film to produce a plurality of real-time programmable dopants within the film. Energy-transporting control paths are placed in the composite film to control the properties of the quantum dot dopants using external energy sources. Charge carriers are driven into the quantum dots by the energy in control paths, and trapped there through quantum confinement, such that the charge carriers form artificial atoms which serve as dopants for the surrounding materials. The "atomic number" of each artificial atom is adjusted through precise variations in the voltage across the quantum dot that confines it. Note that as the artificial atom has no nucleus, and thus no protons, the term "atomic number" is used herein to refer to the number of electrons forming valence shells of the artificial atom. The change in atomic number alters the doping characteristics of the artificial atoms.

Figures 1, 2:
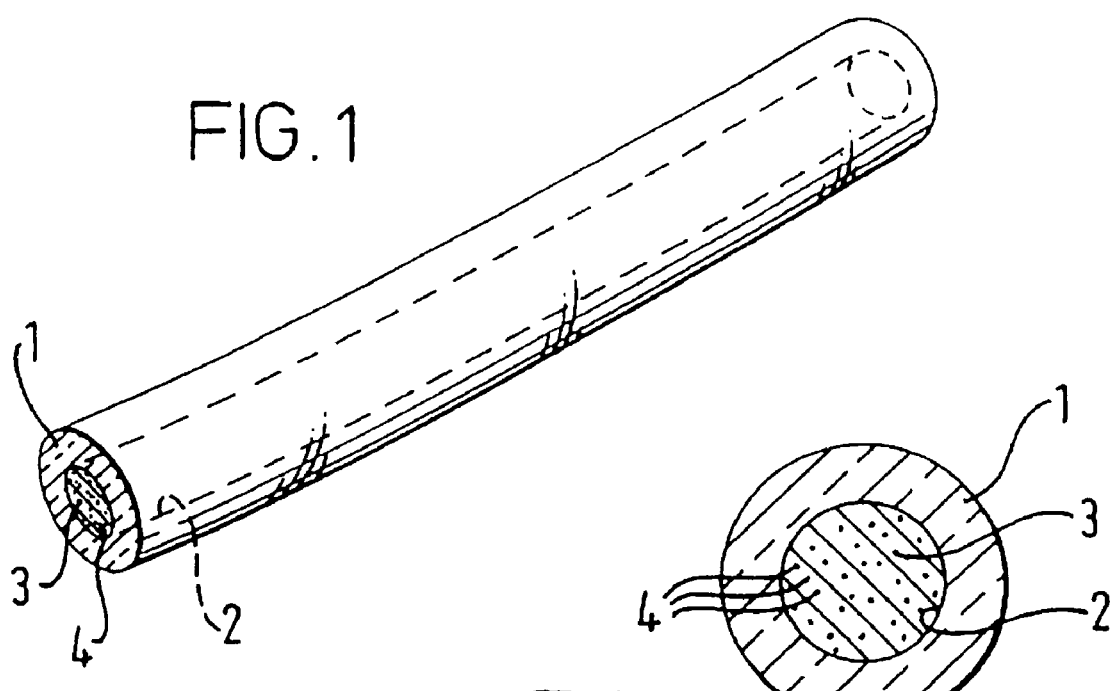
FIGS. 1 and 2 are from the prior art, U.S. Pat. No. 5,881,200 to Burt (1999), and show a hollow optical fiber containing a colloidal solution of quantum dots in a support medium.
Figure 3A:
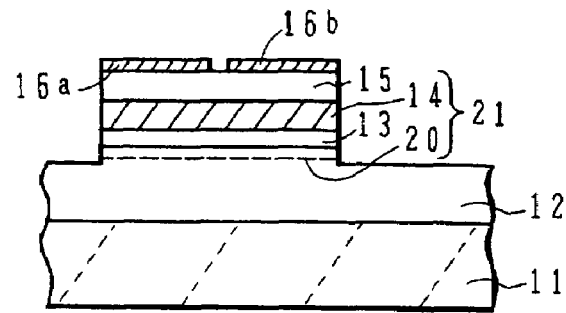
FIGS. 3A and 3B are from the prior art, U.S. Pat. No. 5,889,288 to Futatsugi (1999), and show a semiconductor quantum dot device that uses electrostatic repulsion to confine electrons.
Figure 3B:
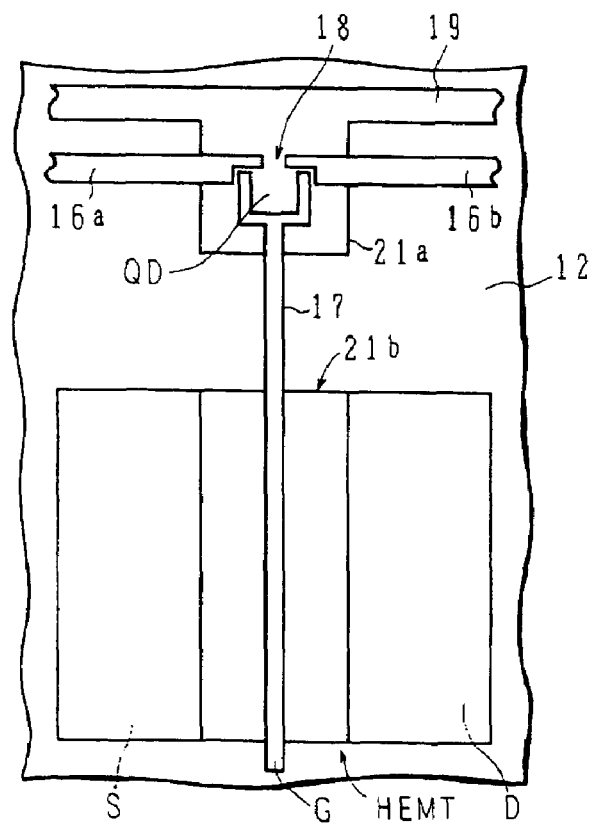
Figure 5:
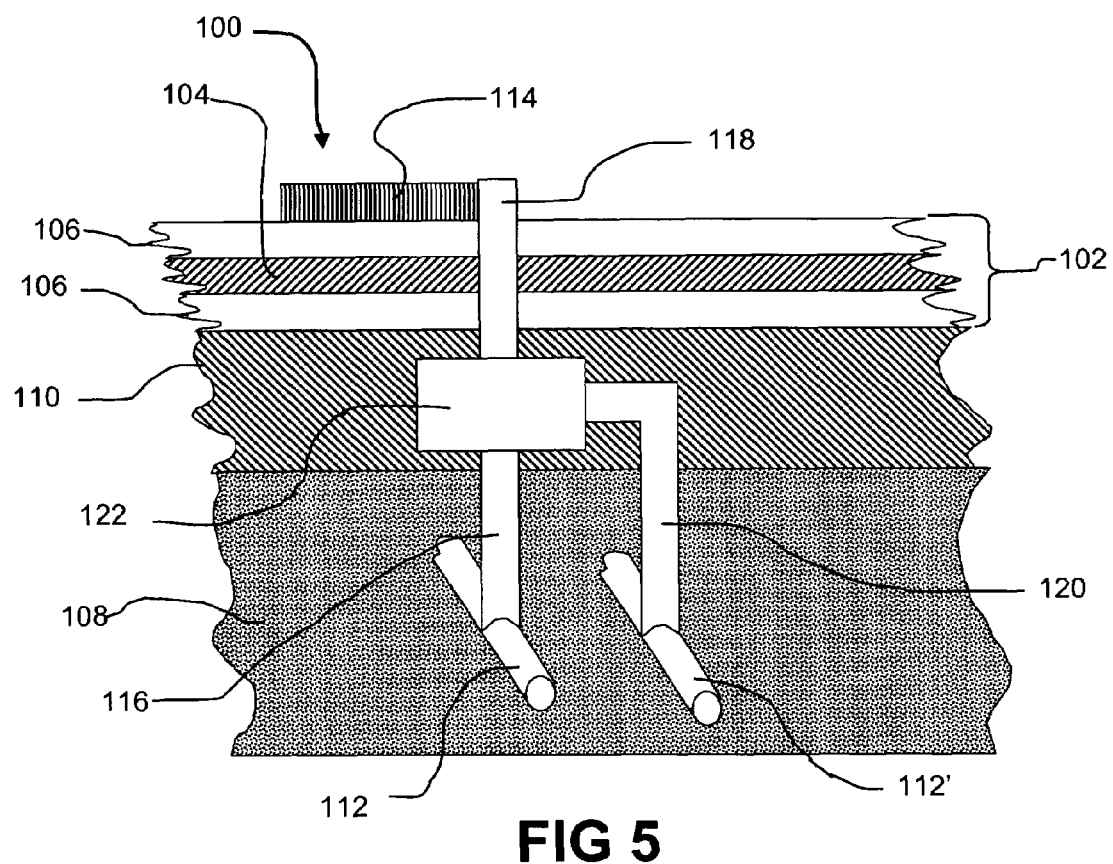
FIG. 5 is a schematic, cutaway view of one embodiment of a material film of the present invention depicting a quantum well formed by an electrode addressed by control wires and including an optional memory layer.

FIG. 5 depicts a cross-sectional view of a layered composite film 100 according to one embodiment of the invention. The layered composite film 100 is a sandwich of materials arranged so as to use an external energy source to produce quantum effects including, but not limited to, serving as a programmable dopant or programmable material. The layered composite 100 includes a quantum well 102, an insulating medium 108, and an optional memory layer 110 positioned between the quantum well 102 and the insulating medium 108. The quantum well 102 is composed of a central or transport layer 104 of a semiconductor material, for example, GaAs, sandwiched between two barrier or supply layers 106 of a semiconductor material with higher conduction energy, for example, AlGaAs. An exemplary composition of the insulating medium 108 is a semiconductor oxide material, for example, $SiO_2$, although a variety of other materials could be used. In this embodiment, the layered composite film 100 further contains control paths formed of wires 112, 112' arranged in the insulating medium 108.

Because of the difference in conduction energies, electrons settle preferentially into the lower energy of the GaAs transport layer 104, where they are free to travel horizontally, i.e., within the transport layer 104, but are confined "vertically" or perpendicular to the transport layer 104 by the higher conduction energy of the barrier layers 106. The semiconductor and oxide materials forming the transport layer 104 and the barrier layers 106 are held together by covalent bonds and, because of their three-dimensional crystal structure, they are strong, non-ductile materials. While brittle in bulk, these semiconductor and oxide materials can be formed into thin films or fibers which are flexible and can be used, for example, in fiberglass, flexible circuitry, or other applications where a combination of strength and flexibility is desirable. No other materials are needed to strengthen or stabilize the layered composite film 100.

The transport layer 104 of the quantum well 102 must be smaller in thickness than the de Broglie wavelength of the charge carriers for the charge carriers to be confined in the quantum well 102. For an electron at room temperature inside a solid material, this wavelength would be approximately 20 nanometers. Thicker quantum wells are possible, although they will only exhibit quantum confinement of the charge carriers at temperatures colder than room temperature. Thinner quantum wells will operate at room temperature and at higher temperatures as long as the de Broglie wavelength of the charge carriers does not exceed the thickness of the transport layer 104.

It will be understood by a person skilled in the art that there are numerous, established fabrication processes capable of producing material layers or films of appropriate thickness and purity for this invention. These may include, but are not limited to, sputtering, chemical vapor deposition, molecular beam epitaxy, and chemically self-assembled layers, including monolayers. Less established, but plausible, alternative fabrication methods include wet chemical evaporation, electroplating, assembly by tailored microorganisms, molecular machines, direct-write nanolithography, e.g., dip pen nanolithography or nanoimprint lithography, and atomic pick-and-place, e.g., with a scanning probe microscope. Other viable methods, although not listed here, may also be used and this listing should not be construed as limiting the scope of the invention.

The surface of the layered composite film 100 includes conductors that serve as the surface electrodes 114 of a quantum dot device. The surface electrodes 114 confine charge carriers in the quantum well 102 into a small space or quantum dot (not pictured) when a reverse-bias voltage is applied. Quantum confinement of the charge carriers is effected by the negative charge on the surface electrodes 114, which repels the electrons and prevents the horizontal escape of the electrons through the transport layer from a region bounded by a group of the surface electrodes 114. The application of an external voltage across the quantum well 102 will affect the conduction energy of the charge carriers, and thus increase or decrease the number of charge carriers trapped in the transport layer 104 in a controlled manner. The surface electrodes 114 are powered by control wire branches 116, 118, 120 reaching to the surface of the layered composite film from the control wires 112, 112' in the insulating medium 108. In an exemplary embodiment, the surface electrodes 114, the control wires 112, 112', and the control wire branches 116, 118, 120 are made of gold, although they may be made of other metals, or other conductive materials, including semiconductors or superconductors.

In addition to wires, the control paths, including the control wire branches, may be formed of semiconductor or superconductor materials, optical fiber, or other conduits for carrying energy. The control paths may further be antennas for receiving signals and energy from electromagnetic waves, for example, radio frequency or microwave antennas. Any of the embodiments of control paths or electrodes described herein may be replicated on a molecular scale through the use of specialized molecules such as carbon nanotubes and fullerenes. The quantum dots may be other sorts of particles or devices than those discussed herein, so long as they accomplish the quantum confinement necessary for the formation of artificial atoms. In addition, the "artificial atoms" may be composed of charge carriers other than electrons, for example, positrons or "holes." The number and relative sizes of the quantum dots with respect to the fiber may also be significantly different than is shown in the drawings.

It will be understood by a person skilled in the art that the surface electrodes 114 of appropriate width, thickness, purity, and positional accuracy may be laid down by a number of established methods. These methods include, but are not limited to, for example, lithographic masking procedures such as electron beam lithography and anodic oxidation lithography, coupled with etching procedures such as wet chemical etch or dry ion milling, and direct-write procedures such as dip pen nanolithography or nanoimprint lithography. Chemical self-assembly is another optional process. Less established, but plausible, alternative methods include assembly by tailored microorganisms or molecular machinery, assembly by atomic pick-and-place, e.g., with a scanning probe microscope, or by atom holography (i.e., exploiting the wavelike properties of atoms at very low temperature). Other viable methods, although not listed here, may also be used and this listing should not be construed as limiting the scope of the invention.

FIG. 5 also depicts an optional memory layer 110 comprising microscopic transistors or other switches 122 that are placed in line with the control wire branches 116, 118, 120 and serve as switches that are capable of turning voltages to the surface electrodes 114 on and off. A first control wire branch extends from the control wire 112 to the switch 122 to serve as a source electrode 116 of the switch 122 and second control wire branch extends from the switch 122 to the surface electrode 114 to serve as a drain electrode 118 of the switch 122. An additional control wire branch extends from a central control wire 112' to serve as a gate electrode 120 for the switch 122. An exemplary form of the switch 122 is a field effect transistor, although numerous other types of switches 122, whether solid-state or mechanical, may be used without affecting the function of the invention. This switching or memory layer 110 is optional, since this switching can be accomplished external to the layered composite film 100. However, it is included here for clarity. Further, the external voltage applied to the surface electrodes 114 may be differentiable at the voltage source or it may be changed by the switches 122 in the memory layer 110. It will be understood by a person skilled in the art that the fabrication and operational connection of microscopic transistors and other microscopic switches is well established in the prior art, and need not be taught here to explain the present invention.

While an exemplary embodiment is depicted and described, it should be understood that the present invention is not limited to this particular configuration. Quantum wells made from other materials and of other designs than described above may be used. Quantum wells designed to trap "holes" or other positive charge carriers are contemplated. Further, heterojunctions may be used in place of quantum wells. The present invention may also employ quantum dashes in the same manner as quantum dot particles with little change in essential function of the invention. The layered composite film 100 may also be protected by an additional insulating layer (not pictured), either continuous or discontinuous, below, above, or surrounding the surface electrodes 114, and/or surrounding the control wires 112, 112' and control wire branches 116, 118, 120.

Note that the exact arrangement of the various layers can be slightly different than is depicted here, without altering the essential structure and function of the invention, which is a programmable dopant composite film. For example, the "sandwich" or composite film may be two-sided, with quantum dot devices on its lower as well as upper surface. In addition, the sandwich may not be flat, but may be folded into a cylinder, sphere, prism, flexible fiber or ribbon, or other shape. The control wires need not be located in an insulation layer below the quantum dot devices, although for some embodiments this may be the most convenient place to locate them. One manner of using the programmable dopant composite film is to place the composite film or a plurality of composite films, as needed, inside a bulk material (e.g., a semiconductor). Alternately, the composite films may be stacked together into a three-dimensional structure whose material properties can be affected by external energy sources, forming a kind of "programmable matter."

Figure 6:
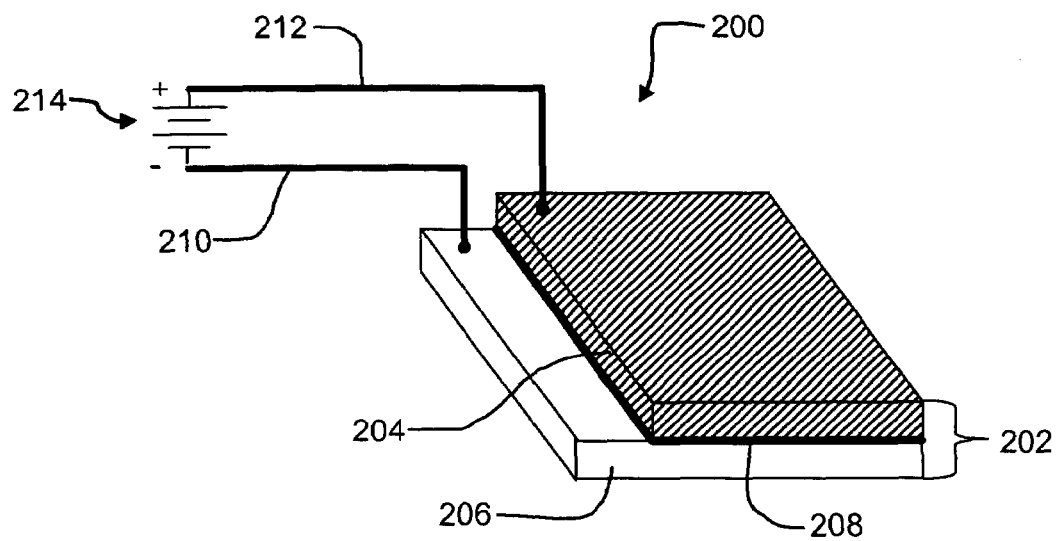
FIG. 6 is a schematic representation of a portion of the present invention detailing a quantum well or heterojunction illustrating the confinement of charge carriers in a two-dimensional layer.

FIG. 6 illustrates the quantum confinement of charge carriers in one dimension in a layered composite film 200. In this embodiment, material layers 204 and 206 form a heterojunction 202. The preferred composition of the heterojunction 202 is a transport layer 204 of a semiconductor, for example, GaAs, in continuous contact with a barrier or supply layer 206 of a semiconductor with higher conduction energy, for example, AlGaAs. Because of the difference in conduction energies, electrons settle preferentially into the lower energy of the GaAs transport layer 204. When a voltage 214 that is less than the breakdown voltage is applied across the heterojunction 202, electrons are driven toward the higher energy region of the barrier layer 206, but do not have sufficient energy to travel through it. Thus, electrons tend to accumulate at the interface between the two layers, forming what is known as a "two dimensional electron gas" 208. This electron accumulation is so called a "gas" because the electrons are free to travel horizontally through this interface like the molecules in a gas, but are confined vertically by the material layers 204 and 206 above and below it. In a more general sense, other charge carriers such as holes can be driven into a heterojunction 202, forming the two-dimensional gas 208. To a novice reader the term "gas" may be somewhat misleading in this context, but it has been well established in the prior art and will be recognized by a person of ordinary skill in the art.

In addition, when control wires 210, 212 are contacted with the transport layer 204 and barrier layer 206 and an external voltage 214 is applied across the heterojunction 202 as shown in FIG. 6, the potential difference between the two layers 204, 206 can be increased or decreased, driving additional charge carriers into or out of the interface in a controlled manner. This has the effect of increasing or decreasing the number of carriers in the "gas" layer 208. It will be understood by a person skilled in the art that the various methods for adhering and electrically contacting control wires 210, 212 to a conducting or semiconducting surface are well established in the art.

Figure 7:
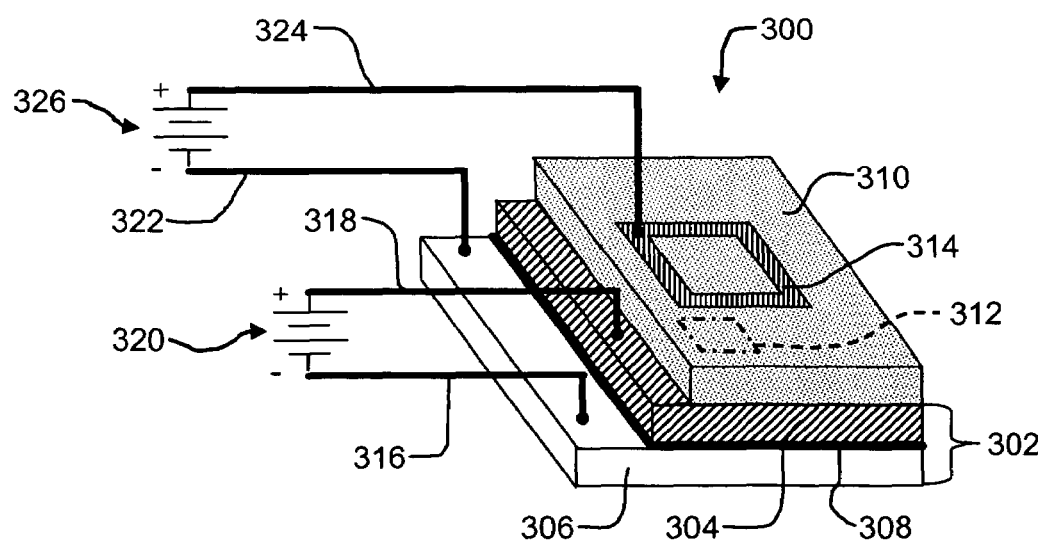
FIG. 7 is a schematic representation of portions of the present invention illustrating the quantum confinement of charge carriers in three dimensions by means of a quantum well or heterojunction, including one or more surface electrodes and control wires.

FIG. 7 illustrates the quantum confinement of charge carriers in three dimensions in a layered composite film forming 300 a quantum dot device. In this embodiment, as in FIG. 6, a transport layer 304 and a barrier layer 306 form a heterojunction 302, whose interface stores a two-dimensional charge carrier "gas" 308. The exact charge density of the gas 308 can be increased or decreased by applying a first voltage 320 across the heterojunction 302 using a first set of control wires 316, 318. FIG. 7 also includes an additional insulating layer 310 on top of the heterojunction 302, and one or more surface electrodes 314 on top of the insulating layer 310. If the electrodes 314 are arranged so as to enclose, or nearly enclose, an area above a quantum well or heterojunction 302 as shown, the electric fields generated by the electrodes 314 can be used to further confine the charge carriers in the gas layer 308.

When a second set of control wires 322, 324 are contacted with the surface electrodes 314 and the transport layer 306 of the heterojunction 302 or quantum well, and a voltage 326 is applied between them, the surface electrodes 314 acquire a net charge. Since like charges repel, a negative charge on the surface electrodes 314 will cause negatively charged charge carriers, e.g., electrons, in the gas layer 308 to be repelled. Similarly, a positive charge on the surface electrodes 314 will repel positive charge carriers. As a result, the uniform "gas" 308 of charge carriers is disrupted, so that charge carriers outside the area enclosed by the electrodes 314 are driven away, while charge carriers inside the enclosed area are driven toward the center. These charge carriers enclosed by the electrodes 314 cannot leave without overcoming the energy barrier of the repulsive force. If the resulting confinement space is smaller than the de Broglie wavelength of the confined charge carriers, then quantum confinement effects will be observed, and the confinement space is known as a quantum dot 312. The entire apparatus, including the transport layer 304 and the barrier layer 306 forming the heterojunction 302, the control wires 316, 318, 322, 324, the insulating layer 310, and the surface electrodes 314, constitutes the quantum dot device 300.

Accordingly, to operate the quantum dot device formed in the composite film 300, voltages 320, 326 from an external source are applied to the control wires 316, 318, 322, 324. A first voltage 320 creates a potential difference between the transport layer 304 and barrier layer 306 of the heterojunction 302 or quantum well via control wires 316, 318, and a second voltage 326 creates a potential difference between the surface electrodes 314 and the bottom barrier layer 306 of the heterojunction 302 or quantum well. Alternatively, the control wires 316, 318, 322, 324 may pass through an optional memory layer of the type depicted in FIG. 5. Such a memory layer may include transistors or other switches embedded in an insulating medium, inline with the control wires 316, 318, 322, 324, and capable of switching the voltage circuits open or closed. The resulting potentials create an electrostatic repulsion that traps charge carriers in the two-dimensional gas layer 308 and further confines the charge carriers to a small area, the quantum dot 312.

Once the charge carriers are trapped in a quantum dot 312, they form a wave structure known as an artificial atom, which is capable of serving as a dopant for any surrounding material, for example, the insulating layer 310. The doping effects of the artificial atom are an inevitable consequence of the alteration to the electronic structure of the composite film 300. Indeed, these effects are known properties of a quantum dot 312. The present invention exploits this principle in a novel way and for a novel purpose, i.e., to employ external signals to alter the optical, electrical, thermal, chemical, magnetic, and mechanical properties of a bulk material in real time, and after the time of manufacture, thus producing a form of "programmable matter."

Because significant material effects are observed at doping levels as low as one dopant atom per million atoms of substrate, and because the structure in FIG. 7 can be produced in a sample area of fewer than 1 million atoms by a variety of known techniques, the presence of one artificial atom in the structure is materially significant. Of further consequence is the size of an artificial atom, which is larger than that of a natural atom. The larger size of an artificial atom also affects its doping properties since it is present in a larger percentage by volume of the material than a natural dopant atom.

In the embodiment shown in FIG. 7, the number of charge carriers confined in the quantum dot 312 can be precisely controlled. First, a specified voltage is placed across the heterojunction 302, by means of the control wires 316, 318, to trap a specified density of charge carriers in the "gas" layer 308. Next, a voltage is applied between the barrier layer 306 of the heterojunction 302 and the surfaced electrode 314 at the top of the device 300, to charge the electrode 314 and create an energy barrier to any charge carrier traveling directly beneath. This voltage 326 is selected such that the desired number of carriers in the region of the gas layer 308 enclosed by the electrode 314 are confined in a quantum dot 312. If the number of carriers exceeds the desired number, the repulsion of charges of the charge carriers confined inside the quantum dot 312 will exceed the repulsion of the energy level of the electrode 314 and the excess carriers will cross the electrode energy barrier and escape into the gas layer 308. The number of carriers trapped in the quantum dot 312 can then be reduced simply by reducing the voltage 326 across the surface electrode 314. This reduces the energy barrier, thus reducing the total net charge the quantum dot 312 can confine, and allows a specified number of carriers to escape.

To increase the number of carriers confined in the quantum dot 312, the voltage 320 across the heterojunction 302 can be increased. This increases the density of charge carriers trapped in the gas layer 308, and the voltage 320 can be selected such that the self-repulsion of the gas 308 drives a specified number of charge carriers across the energy barrier of the electrode 314 and into the quantum dot 312. Alternatively, to increase or decrease the number of charge carriers in the quantum dot 312, the voltage 326 across the surface electrode 314 can be removed, allowing the quantum dot 312 to dissipate into the gas layer 308. Next a new voltage 320 can be applied across the heterojunction 302, and then a new voltage 326 can be applied across the electrode 314, such that the desired number of carriers will be confined in the quantum dot 312 as described above.

Thus, altering the voltages across the control wires 316, 318, 322, 324 produces repeatable changes in the charge of the quantum dot 312, and therefore the atomic number of the artificial atom confined in it. The layered composite film 300 of the present invention exploits this principle in a novel way. It will be seen by a person skilled in the art that altering the "atomic number" of the artificial atom affects its dopant properties, thereby altering the electronic structure of the surrounding materials and affecting their properties. Thus, the layered composite film 300 shown in FIG. 7 is capable of serving as a form of programmable matter, with optical, electrical, thermal, chemical, magnetic, and mechanical characteristics that can be adjusted in real time.

The present invention is not limited to the particular configuration shown in FIG. 7, and includes quantum dot devices with electrodes of other shapes. These possibilities include circles, triangles, regular and irregular polygons, open patterns of adjacent lines, and asymmetric shapes in any combination, such as, for example, a circular electrode with a square central opening, a triangular electrode with a circular central opening, or other similar combinations.

Also notable is that the exact arrangement of the various layers of the layered composite film with programmable dopants may be slightly different than is depicted in FIG. 7 without altering the essential function of the invention. For example, the transport layer 304 does not have to be "on top" of the barrier layer 306 and their positions with respect to each other and the insulating layer 310 and electrode 314 could be reversed, i.e., the electrode 314 and/or the insulating layer 310 could be adjacent the barrier layer 306. Further, a quantum well may be used in place of a heterojunction, a thin metal layer may be sandwiched between semiconducting or insulating layers (as in a thin-film capacitor), or any other method may be used which is capable of confining the charge carrier gas 308 to a thin enough layer that quantum effects will be observed. The device will also function without the insulation layer 310, although there may be a substantial leakage current across the transport layer 304 if the voltage on the surface electrodes 314 exceeds the band gap of the transport layer 304. However, the same is true for the device as pictured in FIG. 7. If the electrode voltage 326 exceeds the band gap of the insulator 310, a current may arc through the insulation layer 310. In either case, for some embodiments of the invention lacking an insulator, the electrode voltage 326 may be selected such that quantum confinement occurs while significant leakage current does not.

Figure 8:
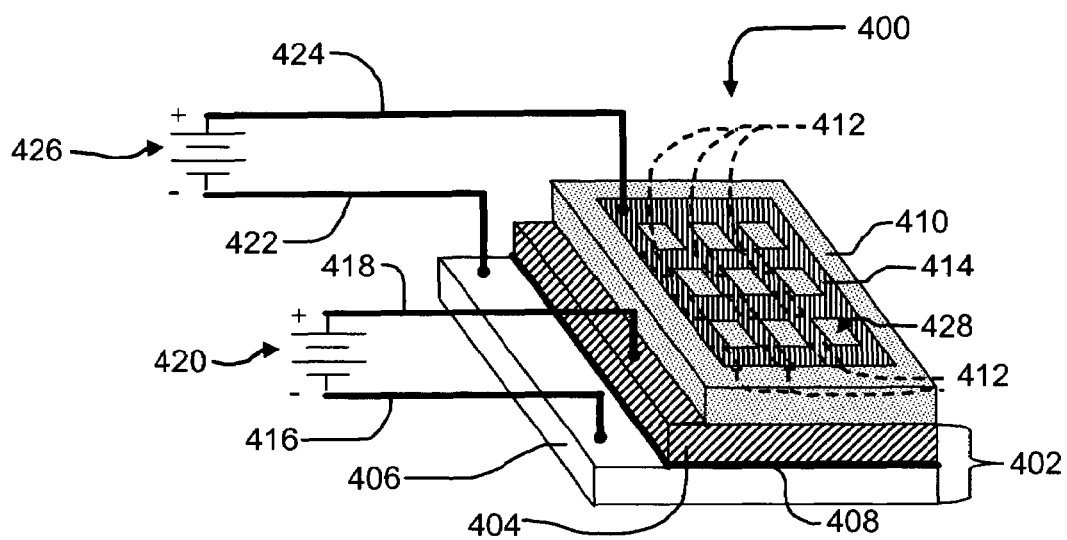
FIG. 8 is a schematic representation of another embodiment of the present invention illustrating an array of quantum dot devices formed by a n electrode grid that confines charge carriers in a plurality of three-dimensional regions.

FIG. 8 illustrates the formation of an arbitrary number of quantum dots 412 in a layered composite film 400 using two independent voltages 420, 426 and four control wires 416, 418, 422, 424. The principle is exactly the same as in FIG. 7, except that the surface electrode on top of the insulating layer 410 has been fashioned into a grid electrode 414 with multiple openings 428. These openings 428 may be physical voids in the electrode material 414, e.g., filled with ambient air, vacuum, or liquid, or they may be composed of some other material which is less conductive than the electrode material 414. For example, the electrode grid 414 could be a metal plate interrupted by a regular pattern of milled pits through which electrons cannot easily conduct, or it could be a low-band gap semiconductor interrupted by a regular pattern of local oxidation, where the oxide has a higher band gap than the semiconductor and thus impedes the entry or passage of electrons. If the openings 428 are smaller than or comparable to the de Broglie wavelength of the confined carriers, then quantum confinement effects will be observed when the heterojunction 402 and surface electrode 414 are charged as described above. Specifically, one quantum dot 412 is formed in the gas layer 408 between the transport layer 404 and the barrier layer 406 beneath each opening 428 in the grid electrode 414, by the same principles discussed above. Thus, a plurality of artificial atoms are created in the layered composite film 400 corresponding to each opening 428 in the grid electrode 414.

A person skilled in the art will realize that the operation of this embodiment is very similar to embodiment of FIG. 7, except that alteration of the voltages 420, 426 across the control wires 416, 418, 422, 424 will produce parallel changes in all of the artificial atoms at once. In the specific case where the grid openings 428 are of precisely equal size and spacing, and the distribution of charge carriers in the gas layer 408 is uniform, it will be understood that the artificial atoms formed in the quantum dots 412 are all identical and will change atomic number and thus doping properties in the same ways and at the same time when the voltages 420, 426 across the control wires 416, 418, 422, 424 are altered. Thus, the complete composite film 400 will include a grid of identical, programmable, artificial atoms whose doping properties alter the optical, electrical, thermal, chemical, magnetic and mechanical properties of the surrounding materials.

In an alternate embodiment, wherein the grid openings 428 are of nonuniform size, shape, or spacing and/or the charge carrier gas 308 is of nonuniform initial distribution, the artificial atoms may or may not be identical, and may or may not respond in identical ways to the influence of the voltages in the control wires 416, 418, 422, 424. However, in this case each individual artificial atom will still respond consistently to any particular voltage setting, and the net behavior of the system will be fully repeatable. As a result, in either case the complete composite film 400 depicted in FIG. 8 is capable of serving as a programmable dopant device or material, i.e., a form of "programmable matter."

A person of ordinary skill in the art will understand that the methods for forming a grid-shaped electrode are similar to those for forming an electrode of any other shape, and need not be described here. However, it should be noted with particular emphasis that the lithographic processes of atom holography and nanoimprint lithography, whether directly depositional or relying on the contamination and later developing and stripping of a "resist" layer, lend themselves to the rapid production of large and relatively uniform grids. Other methods, for example, X-ray crystallography, are capable of producing extremely fine interference patterns that may be used to expose a resist and produce grid-like patterns in a metal layer, which can be used to divide a quantum well or heterojunction into quantum dot regions. These single-stamp methods for producing the electrode or electrodes of a composite film or fiber or other material with programmable dopants are also an embodiment of the present invention. Furthermore, it should also be understood by a person of ordinary skill in the art that the device as depicted in FIG. 8 can be scaled upward in two dimensions almost without limit. Thus, the embodiment pictured in FIG. 8 can be sized to include an arbitrary number of quantum dots 412.

The preferred use of the layered composite film according to the present invention is to embed it inside a bulk material and control it with external signals, in order to affect the bulk properties of the bulk material in real time, through programmable doping. Alternatively, multiple layered composite films can be stacked into a three-dimensional structure or material that includes an extremely large plurality of programmable, artificial atoms. Such a structure could accurately be termed "bulk programmable matter."

Applications for programmable materials are numerous. For example, a person skilled in the art will understand that since the magnetic properties of artificial atoms are affected by the charge in the electrodes, the resulting bulk material according to the present invention can be used as an electromagnet operated by static electricity rather than by direct or alternating current. As another example, recognizing that the thermal properties of a bulk material according to the present invention are affected by the artificial atoms, programmable matter can also be used as a solid-state thermal switch, i.e., it can be switched between thermally conductive and thermally insulating states, forming the thermal equivalent of an electronic transistor or rheostat. As an additional example, recognizing that the chemical properties of a surface are a function of its electronic structure, the control of artificial atoms as programmable dopants in a bulk material according to the present invention can be used to attract or influence atoms or molecules external to the material, as in a catalyst. Programmable matter can also be used, for example, as a color-changing material, for example, in emissive or reflective computer displays. Numerous other applications are possible for these materials and the specific examples listed herein should not be construed as limiting the scope of the invention or its applications.

Figure 9:
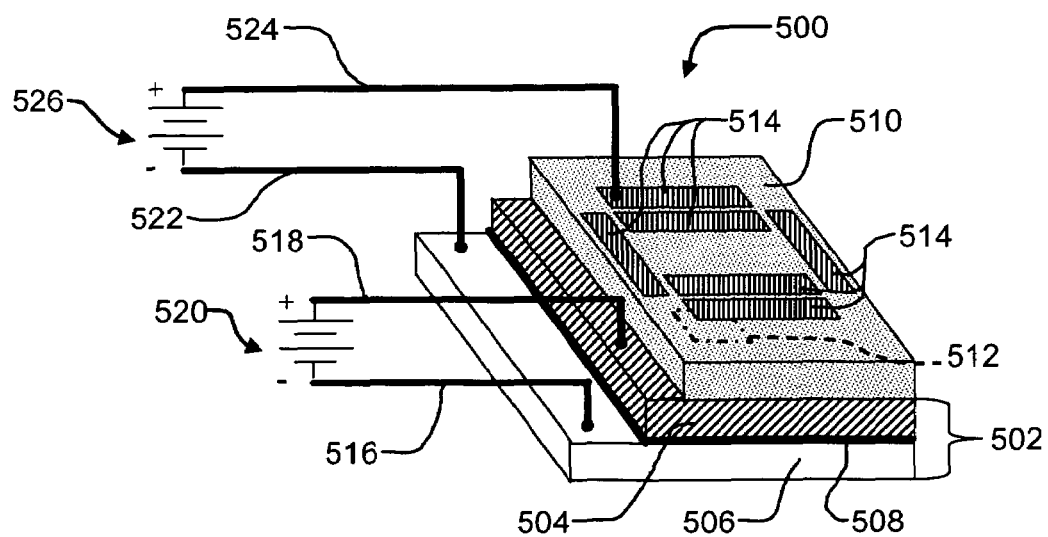
FIG. 9 is a schematic representation of an additional embodiment of the present invention illustrating the quantum confinement of charge carriers in three-dimensions by a plurality of surface electrodes and control wires. For clarity, only a single quantum dot device is shown, but in general this embodiment of the invention incorporates a plurality of such devices in a two-dimensional array.

FIG. 9 illustrates another embodiment of the invention, wherein a layered composite film 500 forms a quantum dot device with multiple electrodes 514. A heterojunction 502 is again formed by the interface between a transport layer 504 and a barrier layer 506. a voltage 520 is applied across the heterojunction 502 via control wires 516, 518 in contact with the barrier layer 506 and the transport layer 504, respectively. A person of ordinary skill in the art will see that the operation of this device is very similar to that described for FIG. 7, except that each electrode 514 is connected to a separate control wire 524 and is controlled by a separate external voltage source 526 also connected to the barrier layer 506 via control wire 522. In FIG. 9, for the sake of clarity, only a single electrode control wire 524 and corresponding voltage source 526 are depicted connecting with one of the electrodes 514, but it should be understood that each of the electrodes 514 is similarly connected via corresponding control wires to a separate voltage source. As in FIG. 7, a quantum dot 512 is formed in the charge carrier gas 508 beneath the area of the insulating layer 510 bounded by the electrodes 514 when the surface electrodes 514 are charged. Collectively, these components constitute a quantum dot device.

As noted, in the embodiment of FIG. 9, each of the surface electrodes has a separate control wire 524 contacted with it, and is controlled by a separate external voltage source 526. However, it is possible and often desirable for multiple of the surface electrodes 514 to be connected to a common external voltage source, so that the electrodes 514 are controlled in groups by a relatively small number of independent voltages. It should also be understood that while a single quantum dot device is formed in the layered composite film 500 in FIG. 9, the invention encompasses composite films incorporating an arbitrarily large number of quantum dots 512, for example, as in FIG. 8. The embodiment of the invention of FIG. 9 shows six surface electrodes 514 bounding the quantum do 512, although greater or fewer electrodes 514 could be used. It should also be understood that the exact shape and position of the surface electrodes 514 could be quite different than what is pictured, so long as the resulting structure is capable of achieving quantum confinement as defined above.

The advantage of the design for the layered composite film 500 of FIG. 9 incorporating multiple electrodes 514 for each quantum dot 512 is that by selecting different voltages on these electrodes it is possible to alter the repulsive electric field, thus affecting size and shape of the confinement regions of the quantum dots 512. A person of ordinary skill in the art will see that this necessarily alters the size and shape of the artificial atom trapped inside the quantum dot 512, either in conjunction with changes to the artificial atom's atomic number or while holding the atomic number constant. Thus, the properties of the artificial atom are adjusted in real time through variations in the charge of the electrodes 514. Adjustment of the voltages 520, 526 on the control wires 516, 518, 522, 524 can therefore affect the characteristics of the artificial atoms, including size, shape or symmetry, number of charge carriers, and energy levels of the carriers. One skilled in the art will realize that the resulting changes in the artificial atom will dramatically affect its properties as a dopant.

Depending on the number of control wires 522, 524 employed in the layered composite film 500, the number of independent voltage sources 526 driving them, and the number of quantum dot devices along the surface of the film, the artificial atoms located near the surface of the film (in the gas layer 508) may all be identical, may represent multiple "artificial elements" in regular or irregular sequences, or may all be different. For example, if the signals sent to each quantum dot 512 were identical, the artificial atoms on the film 500 might all have an atomic number of 2, equivalent to helium, which would otherwise be extremely difficult to introduce as a dopant. Conversely, if two separate sets of control signals were sent, the artificial atoms could be, for example, an alternating pattern of helium (atomic number 2) and carbon (atomic number 6).

Figure 10:
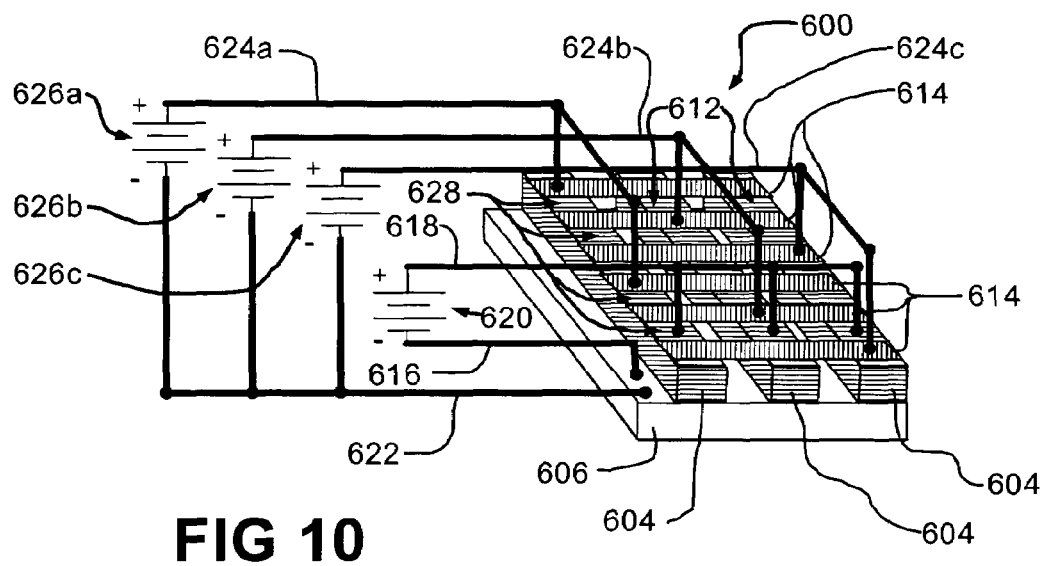
FIG. 10 is a schematic representation of a further embodiment of the present invention depicting a plurality of quantum wires and a grating of parallel electrodes to produce quantum dot confinement regions.

FIG. 10 discloses an additional embodiment of a layered composite film 600 according to the present invention, which uses a quantum wire or a plurality of quantum wires 604 arrayed on a barrier layer 606 in place of a quantum well. A simple grating of parallel electrodes 614, rather than a grid, is used to produce the confinement regions, i.e., quantum dots 612, along the quantum wires 604 in the gaps 628 between the electrodes 614. In this embodiment, a thin strip of a semiconducting material may function as a quantum wire 604, confining electrons in two dimensions when connected with a voltage source 620 across the barrier layer 606 via control wires 616, 618. Further confinement of the electrons in the quantum wires 604 to form the quantum dots 612 is achieved by placing potential across each of the plurality of surface electrodes 614. For clarity of the drawing, only the general locations of some of the quantum dots 612 are indicated along the quantum wires 604, although other quantum dots 612 are formed at similar locations within the quantum wires 604. The electrodes 614 may be electrically connected with one or more voltage sources 626a, 626b, 626c via control wires 624a, 624b, 624c. As shown in FIG. 10 in an exemplary configuration, every third electrode 614 is connected with a respective voltage source 626a, 626b, 626c via a corresponding respective control wire 624a, 624b, 624c.

The quantum wires 604 will typically be composed of a semiconductor material, with or without an outer insulating layer, although in principle a conductive or superconductive material could be used instead. As with the grid openings 428 of FIG. 8, the separation distance between the quantum wires 604 may either be a physical gap filled with ambient air, vacuum, or liquid, or it may be another material which is less conductive, such as an oxide barrier. For example, the quantum wires 604 and the barriers between them could be formed by selective local oxidation of a semiconductor layer in a series of regular stripes, where the oxide stripes form the barriers and the spaces between them form the quantum wires, although many other methods could be used to achieve the same effect. Collectively, these components constitute a quantum dot device in the layered composite film 600.

The embodiment of FIG. 10 holds an additional advantage, in that removing the charge from a particular surface electrode and applying charge to a previously inactive surface electrode will cause the confinement barrier across the quantum wire 604 to shift, with the result that one or more quantum dot regions 612 will shift along the length of the quantum wire 604. Thus, it is possible to create artificial atoms which not only serve as programmable dopants, but can be moved or relocated inside the layered composite film 600. If desired, they can also be formed into moving patterns, whether repeating or not, as in a marquee-type display of incredibly tiny size.

It should be understood, however, that displays are not the only application for movable dopants. A kind of shift register can easily be created from the structure described, such that particular artificial atoms are moved to particular locations within the layered composite film 600. An exemplary application for such a shift register is for use as an extremely compact form of computer memory, whether binary and based on the presence of nonzero charge in a particular location, or numeric and based on the specific value of the charge, i.e., the atomic number of an artificial atom in a particular location. Such a shift register also has applications in chemistry, for example, to chemically attract a particular atom or molecule from a gas or solution to the surface of the programmable material, and then to move it as desired upon the surface. Such a method could be used, for example, to remove contaminants from a gas or liquid. Granted, the binding energy of quantum dots, whether in a covalent, ionic, or other chemical bond, is in general much weaker than the binding energy of natural atoms, but the artificial atom will still exert a nonzero chemical influence, especially at very low temperature.

Figure 11:
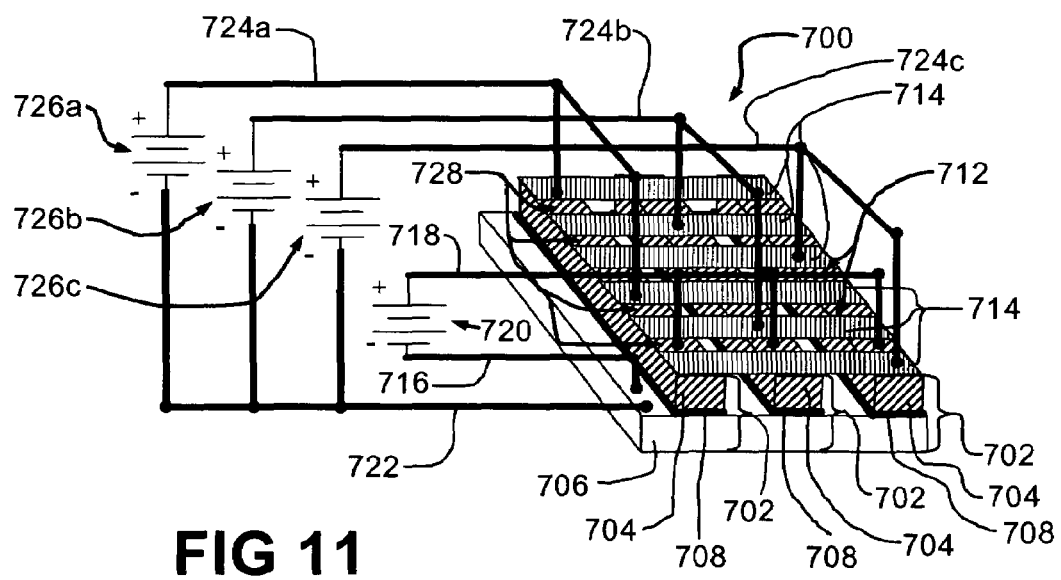
FIG. 11 is a schematic representation of an alternative embodiment of FIG. 1A, wherein the quantum wires are replaced by narrow heterojunctions.

The layered composite film 700 of FIG. 11 is generally the same as the embodiment depicted in FIG. 10, except that the quantum wires 604 have been replaced with heterojunctions 702 formed between narrow transport layer strips 704 mounted on a barrier layer 706. The transport layer strips 704 are of a width narrower than the de Broglie wavelength of the confined carriers, so that the quantum dots 712 occur in the gas layers 708 between the transport layer strips 704 and the barrier layer 706 rather than in the quantum wires 604. A grating of parallel electrodes 714 is again used to produce the confinement regions, i.e., quantum dots 712, in the gas layers 708 along the length of the transport layer strips 704 in the gaps 728 between the electrodes 714. There may also be an insulation layer (not shown) between the electrodes 714 and the transport layer 704.

Confinement of the electrons within the gas layers 708 in two dimensions is achieved when a voltage source 620 is connected with the transport layer strips 704 across the barrier layer 606 via control wires 616, 618. Similarly, three-dimensional confinement of the electrons in the gas layers 708 to form the quantum dots 712 is achieved by placing potential across each of the plurality of surface electrodes 714. For clarity of the drawing, only the general locations of some of the quantum dots 712 are indicated along the transport layer strips 704, although other quantum dots 712 are formed at similar locations in the gas layers 708 along the transport layer strips 704. The electrodes 714 may be electrically connected with one or more voltage sources 726a, 726b, 726c via control wires 724a, 724b, 724c. As shown in FIG. 11 in an exemplary configuration, every third electrode 714 is connected with a respective voltage source 726a, 726b, 726c via a corresponding respective control wire 724a, 724b, 724c. The function and operation of the layered composite film 700 of FIG. 11 are otherwise identical to the function and operation of the embodiment of FIG. 10.

Figure 12:
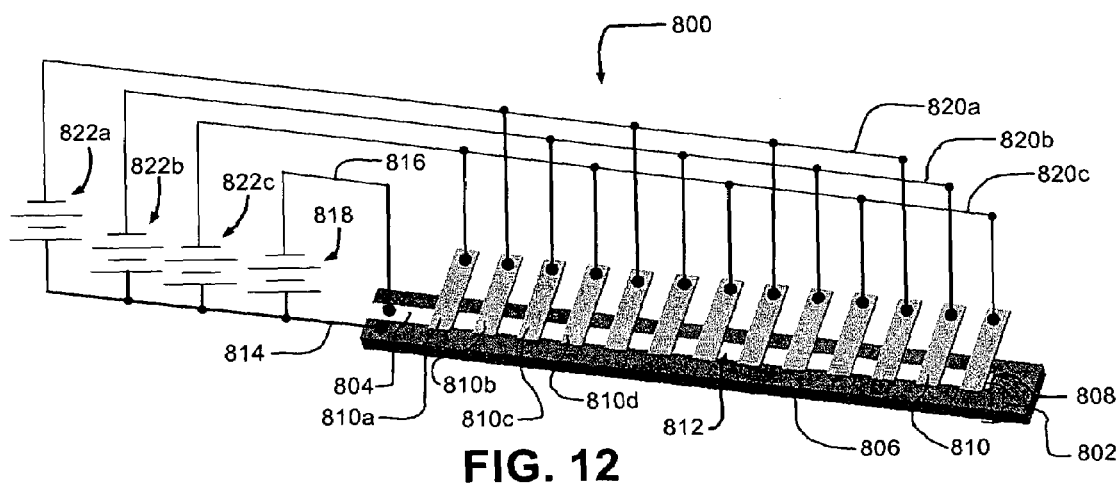
FIG. 12 is a schematic representation of an artificial atom shift register that inducts groups of charge carriers at one end and shifts them to particular locations inside the device.

FIG. 12 discloses a shift register 800 as described above, wherein the quantum dots 812 are formed between the metal electrodes 810 in the gas layer 808, which is formed by the heterojunction 802 between the transport layer strip 804 and the barrier layer 806. In FIG. 12, there are three independent voltage sources 822a, 822b, 822c for the electrodes 810, and every third electrode is controlled by the same source via connection through control wires 820a, 820b, 820c, respectively. This arrangement is only exemplary and other arrangements of voltage sources and control wires may be used. For example, there could be a single voltage source connected with each electrode through a respective control wire that is controlled by a respective switch. In this configuration, the switches would control which electrodes were energized. One additional voltage source 818 connected with the transport layer strip 804 and the barrier layer 806 via control wires 814, 816, respectively, is used to charge the heterojunction 802. An optional insulation layer (not shown) may be placed between the electrodes 810 and the transport layer strip 804 of the heterojunction 802. Additional insulation layers may be provided above or below other layers constituting the shift register 800, without affecting its function.

When the electrodes 810 are charged, they create potential barriers across the gas layer 808, such that the carriers confined therein are driven into quantum dots 812 and form artificial atoms. For the shift register 800 to function, one of the electrode voltage sources 822a, 822b, 822c must remain off at all times. However, when the "off" source is switched on and one of the adjacent "on" sources is switched off again, the barriers are relocated and the quantum dots 812 therefore move laterally to the left or right depending upon the relative positions of the charged and uncharged electrodes 810. For example, when electrodes 810a and 810c are energized, a quantum dot 812 is formed between them, trapping and holding charge carriers as a corresponding artificial atom. Next electrode 810c may be de-energized while electrode 810b is energized. As electrode 810d is already energized, the quantum dot 812 and corresponding artificial atom "moves" or "shifts" its position along the shift register 800 to a position between electrode 810b and 810c. It may additionally be desirable to instantaneously increase the energy level to electrode 810a and/or decrease the energy level to electrode 810d when switching electrode 810c off and electrode 810b on to force the charge carriers into confinement closer to electrode 810d. By graduating or biasing the energy between the electrodes 810 and 810d, the charge carriers forming the artificial atom are forced into a range between electrode 810b and electrode 810d, rather than filling the entire range between electrode 810a and electrode 810d. Thus, the charge carriers that constitute a particular artificial atom may start at the left of the shift register 800 and progress to the right along the heterojunction 802 by switching adjacent electrodes 810 on and off as just described. In this manner, the location of a particular artificial atom can be controlled in one dimension.

In an alternative embodiment, particular pairs of electrodes of the shift register may be controlled by respective common voltage sources. A first quantum dot may be formed between a first pair of electrodes to instantiate an artificial atom of size, shape, atomic number, and/or energy level dictated by the energy of a first voltage source. The charge carriers forming the artificial atom in the first quantum dot can be understood as a first data value. It may be desirable, however, to store a second, different data value in the location of the first quantum dot, but also desirable to retain the first data value. A second voltage source may then be used to energize a second pair of electrodes and create a second quantum dot between the second pair of electrodes to trap and hold a second controlled configuration of charge carriers to form a second artificial atom. However, the energy applied by the second voltage source is the same as the first voltage source, thereby resulting in the second artificial atom being of the same size, shape, atomic number, and/or energy level of the first artificial atom. Thus the first data value now resides in the second quantum dot at a different position on the shift register. At this point, the energy of the first voltage source can be modified, and the first artificial atom is correspondingly modified to create a new or modified artificial atom corresponding to the second data value.

Figure 13:
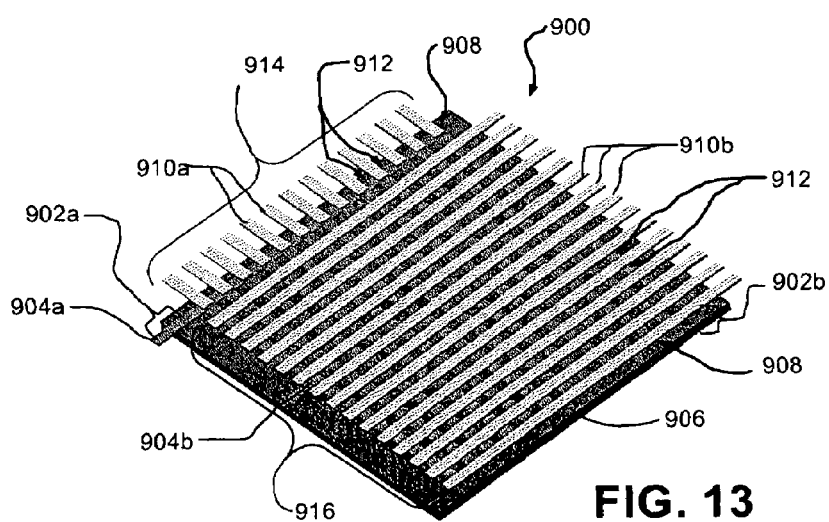
FIG. 13 is a schematic representation of a two-dimensional array of artificial atom shift registers that can be used to control the location of a particular artificial atom or plurality of artificial atoms in two dimensions.

FIG. 13 depicts a two-dimensional shift register 900. The two-dimensional shift register 900 is composed of a first, one-dimensional shift register 914 of the type described in FIG. 12, connected with a perpendicular array 916 of equivalent shift registers. The one-dimensional shift register 914 is of the type described in FIG. 12 and is composed of a transport layer strip 904a on a barrier layer 906, which together form a heterojunction 902a. Quantum dots 912 are formed between the metal electrodes 910a in the gas layer 908 of the heterojunction 902a. The perpendicular array of shift registers 916 is composed of an array of parallel transport layer strips 904b on the barrier layer 906, which together form an array of heterojunctions 902b. An array of electrodes 910b extend perpendicularly across each of the heterojunctions 902b. Quantum dots 912 are formed between the electrodes 910b in the gas layers 908 of the array of heterojunctions 902b. Alternatively, the shift registers may be formed of quantum wires. Each of the heterojunctions 902b is electrically coupled with the heterojunction 902a of the one-dimensional shift register 914. Thus, the electrode of the array of electrodes 910b closest to the one-dimensional shift register 914 must also be energized to confine charge carriers in a quantum dot on the one-dimensional shift register 914. A particular artificial atom can be moved to a particular location along the first shift register 914 and then transferred to a perpendicular shift register in the array 916, whether by ordinary electrical conduction, quantum wavelike propagation, or quantum tunneling of the carriers which constitute the artificial atom. This permits the location of a particular artificial atom to be controlled in two dimensions. Although not pictured for reasons of visual clarity, a third perpendicular axis of shift registers can be added, such that the artificial atoms in the first shift register 914 are moved to locations in the perpendicular array 916, and then transferred into shift registers on the third axis in exactly the same way. This permits the location of a particular artificial atom to be controlled in three dimensions.

Such control over the three-dimensional position of artificial atoms inside a bulk material has applications in materials science similar to those already described for other programmable materials. However, this embodiment has particular application in the field of data storage, e.g., as a three-dimensional computer memory of extremely high density. Data in the form of artificial atoms can be shifted into the device from a single location and moved to the next empty location within the three—dimensional array until the device is full. Then, data can be extracted one artificial atom at a time in a "read" process which is the reverse of the writing process. Alternatively, a random access memory could be formed by placing charge sensors adjacent to the quantum dots 912.

From the description above, the novel programmable dopant composite film of the present invention can be seen to provide a number of capabilities which are not possible with the prior art. First, the present invention provides the ability to place programmable dopants in the interior of bulk materials and to control the properties of these dopants in real time, through external signals. In contrast, the properties of dopants based solely on quantum dot particles can only be controlled at the time of manufacture. Second, the present invention provides the ability to form programmable materials containing "artificial atoms" of diverse types. In contrast, materials based on prior art nanoparticle films can contain only multiple instances of one "artificial element" at a time.

Also from the above description, several advantages of the present invention over the prior art become evident. Materials based on programmable dopant composite films will, in general, be much stronger than materials based on nanoparticle films. Because the semiconductor and oxide layers of layered composite films with programmable dopants are held together with normal covalent bonds rather than van der Waals forces, friction, stiction, or other weak physical or chemical bonds, the composite film will, in general, be much stronger than materials based on nanoparticle films. Layered composite films with programmable dopants according to the present invention can be used in numerous applications where quantum wells, quantum dots, and quantum wires are presently employed. However, the layered composite film with programmable dopants provides isolated energy channels for the electrical or optical stimulation of the quantum dots, permitting the quantum dots to be excited without also affecting the surrounding medium or materials. For example, light can be passed through a quantum dot using optical conduits in the layered composite film, or through optically transparent layers in the layered composite film, without also being shined on or through surrounding areas, except through the film itself. Thus, optical excitations can be limited to just the quantum dots in the film. The substrate can then be doped without being stimulated. This provides for optical stimulation of the quantum dots even when the film includes an opaque substrate. Similarly, an electrical voltage can be channeled to a quantum dot without passing through the surrounding medium, except through the film. Thus, programmable dopant films can be used in numerous applications where ordinary quantum dot devices or particles would not operate, or would disrupt the surrounding material in uncontrolled ways.

Accordingly, a person of ordinary skill in the art will see that the layered composite film s according to this invention can be used as real-time programmable dopants inside bulk materials, as a building block for new materials with unique properties, and as a substitute for quantum wells, quantum wires, and quantum dots in various applications, e.g., as a light source or laser light source.

Although the description above contains many specificities, these should not be construed as limiting the scope of the invention but rather construed as merely providing illustrations of certain exemplary embodiments of this invention. There are various possibilities for making the programmable dopant films of different materials, and in different configurations. The most advantageous configurations are the smallest, since smaller quantum dots can contain charge carriers at higher energies with shorter de Broglie wavelengths and thus display atom-like behavior at higher temperatures. It may also be desirable, for example, to employ electrically conductive molecular wires, such as a carbon nanotubes, as the control wires and surface electrodes.

Numerous other variations exist which do not affect the core principles of the invention's operation. For example, the layered composite film need not be flat or two-dimensional, but could be folded into, wrapped around, or otherwise formed into other shapes. Such shapes include, but are not limited to, cylinders, spheres, cones, prisms, and polyhedrons, both regular and irregular, and asymmetric forms. The layered composite film could also be employed in flexible forms such as sheets, fibers, and ribbons, with quantum dots on one or both surfaces.

When formed into bulk materials, multiple layers of layered composite film with programmable dopants could be stacked into a three-dimensional structure of parallel planes. However, numerous other methods could be used to pack and control the highest possible density of quantum dots. For example, the films could be rolled into a fiber shape and woven or braided. Equally, they could be folded into cubes or other shapes and stacked together three-dimensionally. Other favorable packing configurations are possible as well.

Although various embodiments of this invention have been described above with a certain degree of particularity, or with reference to one or more individual embodiments, those skilled in the art could make numerous alterations to the disclosed embodiments without departing from the spirit or scope of this invention. It is intended that all matter contained in the above description and shown in the accompanying drawings shall be interpreted as illustrative only of particular embodiments and not limiting. All directional references e.g., proximal, distal, upper, lower, upward, downward, left, right, lateral, front, back, top, bottom, above, below, vertical, horizontal, clockwise, and counterclockwise are only used for identification purposes to aid the reader's understanding of the present invention, and do not create limitations, particularly as to the position, orientation, or use of the invention. Connection references, e.g., attached, coupled, connected, and joined are to be construed broadly and may include intermediate members between a collection of elements and relative movement between elements unless otherwise indicated. As such, connection references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the basic elements of the invention as defined in the following claims.

What is claimed is:

1. A shift register device for creating a real-time, tunable, doping effect within a material, the device comprising
a thin, flexible film having at least one stripe-shaped pattern formed therein, wherein the at least one stripe-shaped pattern does not have substantial variation in either of material composition and chemical doping concentration therein along a length of each stripe-shape of the at least one stripe-shaped pattern;
a plurality of quantum dots, positioned in the at least one stripe-shaped pattern within the film;
a plurality of charge carriers capable of being confined within the plurality of quantum dots to form a respective plurality of artificial atoms;
a plurality of electrodes supported by the film, wherein
each of the plurality of electrodes is spaced apart from an adjacent one or more of the plurality of electrodes and is electrically insulated from each adjacent one of the plurality of electrodes, and
each of the plurality of electrodes is positioned in a horizontal plane above and from a top plan view between a respective pair of the plurality of quantum dots; and
a plurality of control paths formed at least partially in the film, wherein
each of the plurality of control paths is operatively coupled with a respective subset of the plurality of electrodes; and
each of the plurality of control paths is adapted to carry energy to its respective subset of the plurality of electrodes; wherein when
a first pair of electrodes of the plurality of electrodes is energized via a first set of one or more of the plurality of control paths, a first subset of the plurality of charge carriers is trapped and held in a first quantum dot of the plurality of quantum dots in a controlled configuration, thus forming a first artificial atom of particular size, shape, atomic number, and/or energy level; and when
one electrode of the first pair of electrodes is de-energized and a second pair of electrodes of the plurality of electrodes is energized via a second set of one or more of the plurality of control paths, the first subset of plurality of charge carriers is shifted into a second quantum dot where it is trapped and held in a controlled configuration by the second pair of electrodes to form a second artificial atom of particular size, shape, atomic number, and energy level identical to the first artificial atom; and wherein
the first and second artificial atoms and additional artificial atoms are formed and shifted along the at least one stripe-shaped pattern in the film in this manner to create a pattern of artificial atoms that has a doping effect on the film; and
upon further shifting of the first, second, and additional artificial atoms, an alternate pattern of artificial atoms is created that has an alternate doping effect on the film.

2. The shift register device of claim 1 further comprising
at least three voltage sources, wherein
a first voltage source is electrically connected via the first one of the plurality of control paths with a first one of the plurality of electrodes and a fourth one of the plurality of electrodes;
a second voltage source is electrically connected via the second one of the plurality of control paths with a second of the plurality of electrodes; and
a third voltage source is electrically connected via a third one of the plurality of control paths with a third of the plurality of electrodes; and wherein
the first pair of electrodes comprises a first electrode and a second electrode;
the second pair of electrodes comprises a third electrode and a fourth electrode; and
the third electrode is positioned between the first and second electrodes and the second electrode is positioned between the third and fourth electrodes; and when
the first voltage source energizes the first electrode and the fourth electrode,
the third voltage source energizes the third electrode, and
the second voltage source is initially set to zero,
the first artificial atom is formed in the first quantum dot between the first electrode and the third electrode; and when
the first voltage source energizes the first electrode and the fourth electrode,
the second voltage source energizes the second electrode, and
the third voltage source is set to zero,
the second artificial atom is formed in the second quantum dot between the second electrode and the fourth electrode.

3. The shift register device of claim 1 further comprising
two or more voltage sources connected with one or more of the plurality of control paths to supply energy to the plurality of electrodes;
wherein when all but one, a first electrode, of the plurality of electrodes are energized by the two or more voltage sources, the first pair of electrodes comprises each of the plurality of electrodes adjacent to the first electrode; and
when the energy supplied to one of the electrodes adjacent to the first electrode is turned off and the first electrode is contemporaneously energized, the first artificial atom correspondingly moves along the shift register, whereby the second controlled configuration of charge carriers are the same as the first controlled configuration of charge carriers, and wherein when
the energy supplied to the plurality of electrodes is switched in sequence, whereby one of the plurality of electrodes is non-energized and all other of the plurality of electrodes are energized at any given time, the first artificial atom can be moved to any of the plurality of quantum dots in the shift register.

4. The shift register device of claim 1 further comprising
at least one voltage source connected with the plurality of control paths; and
a plurality of switches, wherein each switch is connected with a respective control path to control the energization of the subset of electrodes connected with the respective control path.

5. The shift register device of claim 1, wherein each of the plurality of electrodes is parallel to each adjacent electrode from the plurality of electrodes.

6. The shift register device of claim 1, wherein
a first subset of the plurality of electrodes is parallel to each adjacent electrode in the first subset; and
a second subset of the plurality of electrodes is parallel to each adjacent electrode in the second subset.

7. The shift register device of claim 1, wherein the thin, flexible film further comprises
a first barrier layer;

a second barrier layer; and a transport layer located between the first barrier layer and the second barrier layer; wherein the first barrier layer and the first transport layer are adapted to confine the plurality of charge carriers in one dimension;

when energized, the first pair of electrodes creates a first electric field that interacts with the first barrier layer, the second barrier layer, and the transport layer to instantiate the first quantum dot; and when energized, the second pair of electrodes creates a second electric field that interacts with the first barrier layer, the second barrier layer, and the transport layer to instantiate the second quantum dot.

8. The shift register device of claim 7, wherein the first barrier layer and the transport layer together comprise a plurality of quantum wires spaced apart from each other, parallel to each other, and supported by the second barrier layer; and the at least one stripe-shaped pattern forms at least one of the plurality of quantum wires.

9. The shift register device of claim 1, wherein the thin, flexible film further comprises a transport layer; and a barrier layer with a higher band energy than the transport layer; wherein the transport layer and the barrier layer together form a heterojunction;

the heterojunction is adapted to confine the plurality of charge carriers in one dimension;

when energized, the first pair of electrodes creates a first electric field that interacts with the heterojunction to instantiate the first quantum dot; and when energized, the second pair of electrodes creates a second electric field that interacts with the heterojunction to instantiate the second quantum dot.

10. The shift register device of claim 1, wherein the plurality of electrodes is formed of a semiconductor material and each of the plurality of electrodes is insulated from adjacent electrodes by regions of a second material with a higher band gap than the semiconductor material.

11. A one-dimensional shift register device for creating a real-time, tunable doping effect within a material, the device comprising a thin, flexible film comprising two or more layers of semiconductor material; wherein a first layer has a lower band energy than an adjacent second layer;

the film has at least one stripe-shaped pattern formed therein, and the at least one stripe-shaped pattern does not have substantial variation in either of material composition and chemical doping concentration therein along a length of each stripe-shape of the at least one stripe-shaped pattern;

a plurality of charge carriers capable of being confined in the at least one stripe-shaped pattern within the film between the first and second layers to form artificial atoms;

a plurality of electrodes arranged in parallel and supported by the film, wherein each of the plurality of electrodes is spaced apart from an adjacent one or more of the plurality of electrodes;

a plurality of control paths formed at least partially in the film, wherein each of the plurality of control paths is operatively coupled with a respective subset of the plurality of electrodes and is adapted to carry energy to the respective subsets of the plurality of electrodes; and a plurality of voltage sources, wherein each of the plurality of voltage sources is electrically connected via one or more of the plurality of control paths with one or more of the plurality of electrodes; and wherein when a first pair of electrodes of the plurality of electrodes is energized via a first set of one or more of the plurality of control paths, a first subset of the plurality of charge carriers is trapped and held in a controlled configuration between the first and second layers, thus forming a first artificial atom of particular size, shape, atomic number, and/or energy level; and when one electrode of the first pair of electrodes is de-energized and a second pair of electrodes of the plurality of electrodes is energized via a second set of one or more of the plurality of control paths, the first subset of the plurality of charge carriers is shifted into a second area bounded by an electric field generated by the second pair of electrodes where the first subset of the plurality of charge carriers is trapped and held in a controlled configuration to form a second artificial atom of particular size, shape, atomic number, and/or energy level identical to the first artificial atom; and wherein the first and second artificial atoms and additional artificial atoms are formed and shifted along the at least one stripe-shaped pattern in the film in this manner to create a pattern of artificial atoms that has a doping effect on the film; and upon further shifting of the first, second, and additional artificial atoms, an alternate pattern of artificial atoms is created that has an alternate doping effect on the film.

12. The one-dimensional shift register device of claim 11, wherein the film further comprises a first barrier layer;

a second barrier layer; and a transport layer located between the first barrier layer and the second barrier layer; wherein the first barrier layer and the first transport layer are adapted to confine the plurality of charge carriers in one dimension; and the first quantum dot and the second quantum dot are instantiated in the transport layer.

13. The one-dimensional shift register device of claim 11, wherein the at least one stripe-shaped pattern forms a quantum wire.

14. The one-dimensional shift register device of claim 11, wherein the first layer comprises a transport layer; and the second layer comprises a barrier layer; wherein the transport layer and the barrier layer together form a heterojunction;

the heterojunction is adapted to confine the plurality of charge carriers in one dimension; and the first artificial atom and the second artificial atom are instantiated in the heterojunction.

* * * * *

UNITED STATES PATENT AND TRADEMARK OFFICE
CERTIFICATE OF CORRECTION

PATENT NO. : 7,659,538 B2 Page 1 of 1
APPLICATION NO. : 11/144326
DATED : February 9, 2010
INVENTOR(S) : Gary E. Snyder and Wil McCarthy It is certified that error appears in the above-identified patent and that said Letters Patent is hereby corrected as shown below:

Col. 25, claim 1, line 52 - "and" should read "and/or" per the Amendment filed on December 9, 2009.

Signed and Sealed this

Eighth Day of June, 2010

David J. Kappos
*Director of the United States Patent and Trademark Office*